(12) United States Patent
Izawa et al.

(10) Patent No.: US 10,761,384 B2
(45) Date of Patent: Sep. 1, 2020

(54) ELECTRO-OPTICAL DEVICE AND ELECTRONIC APPARATUS

(71) Applicant: SEIKO EPSON CORPORATION, Tokyo (JP)

(72) Inventors: Shotaro Izawa, Chitose (JP); Satoshi Ito, Eniwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 61 days.

(21) Appl. No.: 16/166,318

(22) Filed: Oct. 22, 2018

(65) Prior Publication Data

US 2019/0121209 A1 Apr. 25, 2019

(30) Foreign Application Priority Data

Oct. 23, 2017 (JP) ................................ 2017-204206

(51) Int. Cl.
*G02F 1/1362* (2006.01)
*G02F 1/1368* (2006.01)
(Continued)

(52) U.S. Cl.
CPC ...... *G02F 1/136213* (2013.01); *G02F 1/1368* (2013.01); *G02F 1/133345* (2013.01); *G02F 1/134309* (2013.01); *G02F 1/136286* (2013.01); *H01L 27/124* (2013.01); *H01L 27/1248* (2013.01); *H01L 27/1255* (2013.01); *H01L 28/60* (2013.01); *H01L 29/41733* (2013.01); *H01L 29/42384* (2013.01); *H01L 29/78633* (2013.01); *H01L 29/78648* (2013.01); *H01L 29/78672* (2013.01); *G02F 1/136209* (2013.01); *G02F 2001/13685* (2013.01); *G02F 2001/136218* (2013.01);
(Continued)

(58) Field of Classification Search
None
See application file for complete search history.

(56) References Cited

U.S. PATENT DOCUMENTS 6,654,073 B1 * 11/2003 Maruyama ........ G02F 1/136213
349/138
2002/0018278 A1 2/2002 Sato
(Continued)

FOREIGN PATENT DOCUMENTS

JP 2004-355028 A 12/2004
JP 2008-40399 A 2/2008
(Continued)

*Primary Examiner* — Edward J Glick
*Assistant Examiner* — David Y Chung
(74) *Attorney, Agent, or Firm* — Oliff PLC

(57) ABSTRACT

On the first side substrate of an electro-optical device, a first maintenance capacitance is formed by a first capacitance electrode, a first dielectric layer, and a second capacitance electrode overlapped with each other on a bottom and an inner walls of a first recess section formed in an inter-layer insulation film. The inter-layer insulation film needs to be thick and thus an inter-layer insulation film needs to be thin. A first capacitance line is formed on a surface of the inter-layer insulation film on the side of a pixel electrode. Thus, the first capacitance line shields a section between a gate electrode and the second capacitance electrode to which a drain potential is applied.

8 Claims, 13 Drawing Sheets

(51) Int. Cl.
  *H01L 29/423*    (2006.01)
  *H01L 29/417*    (2006.01)
  *G02F 1/1333*    (2006.01)
  *H01L 49/02*     (2006.01)
  *H01L 27/12*     (2006.01)
  *G02F 1/1343*    (2006.01)
  *H01L 29/786*    (2006.01)

(52) U.S. Cl.
  CPC .... *G02F 2202/104* (2013.01); *G02F 2203/01* (2013.01); *H01L 29/78675* (2013.01)

(56) References Cited

U.S. PATENT DOCUMENTS

| | | | |
|---|---|---|---|
| 2006/0098132 A1* | 5/2006 | Shiota | G02F 1/136213 349/43 |
| 2009/0195489 A1* | 8/2009 | Hung | G02F 1/136286 345/92 |
| 2013/0075799 A1* | 3/2013 | Oyamada | H01L 27/1255 257/296 |
| 2016/0293644 A1 | 10/2016 | Sugimoto | |
| 2017/0082893 A1 | 3/2017 | Ito | |

FOREIGN PATENT DOCUMENTS

| | | |
|---|---|---|
| JP | 2013-073033 A | 4/2013 |
| JP | 3197990 U | 6/2015 |
| JP | 2017-58537 A | 3/2017 |

\* cited by examiner

ELECTRO-OPTICAL DEVICE AND ELECTRONIC APPARATUS

BACKGROUND

1. Technical Field

The invention relates to an electro-optical device provided with a pixel transistor and a holding capacitance on a first side substrate, and to an electronic apparatus.

2. Related Art

An electro-optical device (liquid crystal apparatus) which is used as the light valve of a transmission-type display apparatus and the like includes a first side substrate, on which a pixel transistor and a maintenance capacitance are formed, a second side substrate, on which a counter electrode is formed, and an electro-optical layer (liquid crystal layer) arranged between the first side substrate and the counter electrode. In the electro-optical device, the first side substrate has a scan line formed on the side of a pixel electrode relative to a semiconductor layer of the pixel transistor. A part of the scan line constitutes a gate electrode. A holding capacitance is constituted by a drain electrode (lower electrode), a dielectric layer, and a capacitance line (upper electrode), on a side of the pixel electrode relative to the scan line (see JP-A-2017-58537). Another technique for constituting a maintenance capacitance has been proposed (see JP-A-2008-40399). Specifically, the maintenance capacitance is constituted by laminating a lower electrode electrically coupled to a drain electrode, a dielectric layer, and a capacitance line (upper electrode) to which a common potential is applied on a bottom and inner walls of a recess section formed in an inter-layer insulation film. With this configuration, a holding capacitance with a large electrostatic capacitance can be formed within a small planer area.

The maintenance capacitance described in JP-A-2008-40399 may be applied to the electro-optical device described in JP-A-2017-58537 to achieve a high holding capacitance. In such a case, the recess section for constituting the holding capacitance is formed in a region overlapping with the gate electrode in a plan view in an inter-layer insulation film (a second inter-layer insulation film) arranged between the gate electrode and the pixel electrode. The inter-layer insulation film needs to be thick to have the recess section formed therein. This requires the inter-layer insulation film (first inter-layer insulation film), interposed between the gate electrode and an electrode to which a drain potential is applied, to be thin. With this configuration, electrical coupling is likely to occur between the gate electrode to which a scan signal is supplied and the lower electrode to which the drain potential is applied. This coupling might lead to malfunctioning of the pixel transistor and thus is not preferable.

SUMMARY

In view of the above, an advantage of some aspects of the invention is that an electro-optical device configured to prevent electrical coupling from occurring between the gate and the drain, even when a holding capacitance is formed with a recess section in a region overlapping with a gate electrode in a plan view, and an electronic apparatus are provided.

To solve the problem described above, an electro-optical device according to an aspect of the invention includes a first side substrate provided with a pixel electrode on one side of a first substrate, a second side substrate, provided with a common electrode to which a common potential is applied on a surface of a second substrate on a side of the first side substrate, the second substrate facing the first side substrate, and an electro-optical layer arranged between the first side substrate and the second side substrate. The first side substrate includes a pixel transistor including a semiconductor layer arranged between the first substrate and the pixel electrode, a gate electrode arranged on a side of the pixel electrode with respect to the semiconductor layer, a source electrode arranged between the pixel electrode and the semiconductor layer, and electrically coupled to a source region of the semiconductor layer, and a drain electrode arranged between the pixel electrode and the semiconductor layer, and electrically coupled to a drain region of the semiconductor layer, a first scan line extending in a first direction and electrically coupled to the gate electrode, a data line, between the semiconductor layer and the pixel electrode, extending in a second direction intersecting the first direction, and electrically coupled to the source electrode, a first inter-layer insulation film covering the gate electrode from a side of the pixel electrode, a first capacitance line to which the common potential is applied, the first capacitance line extending on a surface of the first inter-layer insulation film on the side of the pixel electrode to overlap with the gate electrode in a plan view, a second inter-layer insulation film covering the first capacitance line from the side of the pixel electrode, and including a first recess section that overlaps with the first capacitance line in a plan view, a first capacitance electrode arranged from a bottom of the first recess section to a surface of the second inter-layer insulation film on the side of the pixel electrode, and electrically coupled to the first capacitance line at the bottom of the first recess section, a second capacitance electrode overlapping with the first capacitance electrode from the side of the pixel electrode and electrically coupled to the drain electrode and the pixel electrode, and a first dielectric layer arranged between the first capacitance electrode and the second capacitance electrode, for constituting, with the first capacitance electrode and the second capacitance electrode, a first holding capacitance.

As described above, the first holding capacitance is formed by the first capacitance electrode, the first dielectric layer, and the second capacitance electrode that overlap on the bottom, the inner walls, and the like of the first recess section formed in the second inter-layer insulation film, and thus a large electrostatic capacitance can be achieved even when an occupied planer area is small. With this configuration, the second inter-layer insulation film needs to be thick and thus the first inter-layer insulation film needs to be thin. Still, the first capacitance line is formed on the surface of the first inter-layer insulation film on the side of the pixel electrode, and the first capacitance line shields a section between the second capacitance electrode to which the drain potential is applied and the gate electrode. This can prevent an occurrence of electrical coupling between the gate and the drain.

The invention may employ an aspect in which the source electrode and the drain electrode are formed of a conductive layer identical to a conductive layer of which the first capacitance line is formed, on the surface of the first inter-layer insulation film on the side of the pixel electrode. With this aspect, the source electrode, the drain electrode, and the first capacitance line can be formed of the same conductive layer in the same process.

The invention may employ an aspect in which the first side substrate includes a second capacitance line to which the common potential is applied, the second capacitance line extending between the second capacitance electrode and the pixel electrode, a third inter-layer insulation film covering the second capacitance line from the side of the pixel electrode, and including a second recess section that overlaps with the second capacitance line in a plan view, a third capacitance electrode arranged from a bottom of the second recess section to a surface of the third inter-layer insulation film on the side of the pixel electrode, and electrically coupled to the second capacitance line at the bottom of the second recess section, a fourth capacitance electrode overlapping with the second capacitance electrode from the side of the pixel electrode, and electrically coupled to the drain electrode and the pixel electrode, and a second dielectric layer, arranged between the third capacitance electrode and the fourth capacitance electrode, for constituting, with the third capacitance electrode and the fourth capacitance electrode, a second holding capacitance. With this aspect, the second holding capacitance is formed by the third capacitance electrode, the second dielectric layer, and the fourth capacitance electrode that overlap on the bottom, the inner walls, and the like of the second recess section formed in the third inter-layer insulation film, and thus the second holding capacitance can have a large electrostatic capacitance even when an occupied planer area is small. Thus, the electro-optical device to which the invention is applied includes the first maintenance capacitance and the second maintenance capacitance electrically coupled in parallel, and thus has the maintenance capacitance with a large electrostatic capacitance. Thus, a high-quality image can be displayed.

The invention may employ an aspect in which the second capacitance line extends in the second direction to overlap with the data line. With this aspect, the second capacitance line and the data line can be used for shielding the semiconductor layer from light from the side of the pixel electrode.

The invention may employ an aspect in which the second inter-layer insulation film has a flat surface on the side of the pixel electrode. With this aspect, the first capacitance electrode, the first dielectric electrode, and the second capacitance electrode can be appropriately formed, and also the second capacitance line, the third capacitance electrode, the second dielectric electrode, and the fourth capacitance electrode can be appropriately formed.

The invention may employ an aspect in which the first scan line extends in the first direction between the semiconductor layer and the first inter-layer insulation film, and the first capacitance line extends in the first direction to overlap with the first scan line in a plan view. With the invention, an occurrence of the electrical coupling is prevented between the first scan line and the electrode to which a drain potential is applied. Thus, the first capacitance line and the first scan line can be used for shielding the semiconductor layer from light from the side of the pixel electrode.

The invention may employ an aspect in which the first side substrate includes a second scan line extending in the first direction to overlap with the first scan line, between the first substrate and the semiconductor layer, and a fourth inter-layer insulation film arranged between the semiconductor layer and the second scan line, and the first scan line is electrically coupled to the second scan line through a first contact hole formed through the fourth inter-layer insulation film. With this aspect, redundant wiring can be configured with the first scan line and the second scan line, and the second scan line can be used for shielding the semiconductor layer from light from the side of the first substrate.

The invention may employ an aspect in which the first inter-layer insulation film includes a fifth inter-layer insulation film arranged between the semiconductor layer and the first capacitance line, and a sixth inter-layer insulation film arranged between the fifth inter-layer insulation film and the first capacitance line, the gate electrode is arranged between the fifth inter-layer insulation film in the first inter-layer insulation film and the semiconductor layer, the first scan line is arranged between the fifth inter-layer insulation film and the sixth inter-layer insulation film in the first inter-layer insulation film, and a second contact hole through which the first scan line and the gate electrode are electrically coupled is formed in the fifth inter-layer insulation film. With this aspect, the first scan line can have a shape and the like appropriate for transmitting signals and shielding light, regardless of the shape and the like of the gate electrode.

The electro-optical device according to the invention is used for various electronic apparatuses. In the invention, when the electro-optical device is used for a projection display apparatus that is one example of the electronic apparatuses, the projection display apparatus is provided with a light source unit that emits light to be supplied to the electro-optical device and a projection optical system that projects light modulated by the electro-optical device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
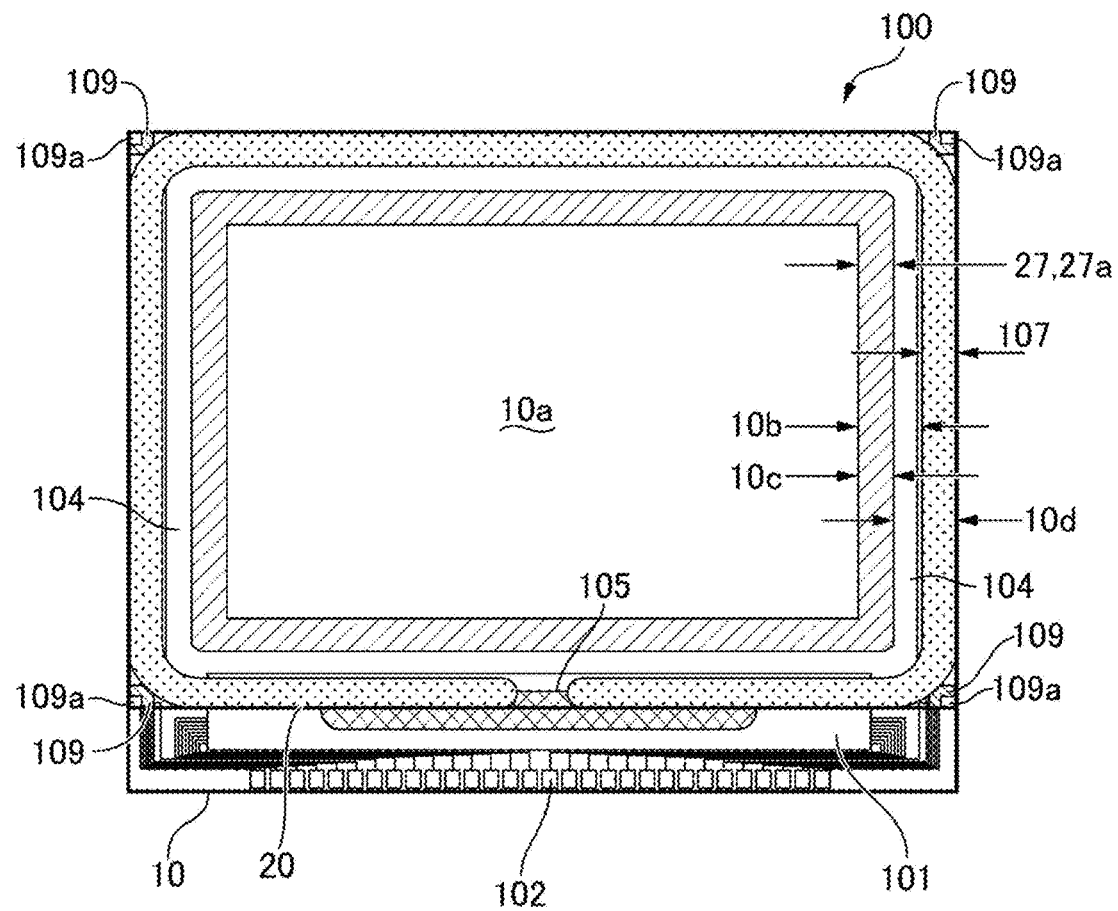
FIG. 1 is a plan view illustrating an electro-optical device to which the invention is applied.

Exemplary embodiments of the invention will be described with reference to the accompanying drawings. Meanwhile, in the drawings which are referred to in the description below, each layer and each member are illustrated in sizes which can be recognized in the drawing, and thus the scales thereof are different for each layer and each member. In addition, in the description below, when a layer which is formed on a first side substrate is described, an upper layer side or a surface side means a side opposite to a side on which the substrate is positioned (or means a side on which a second side substrate is positioned), and a lower layer side means a side on which the substrate is positioned.

Configuration of Electro-optical Device

Figure 2:
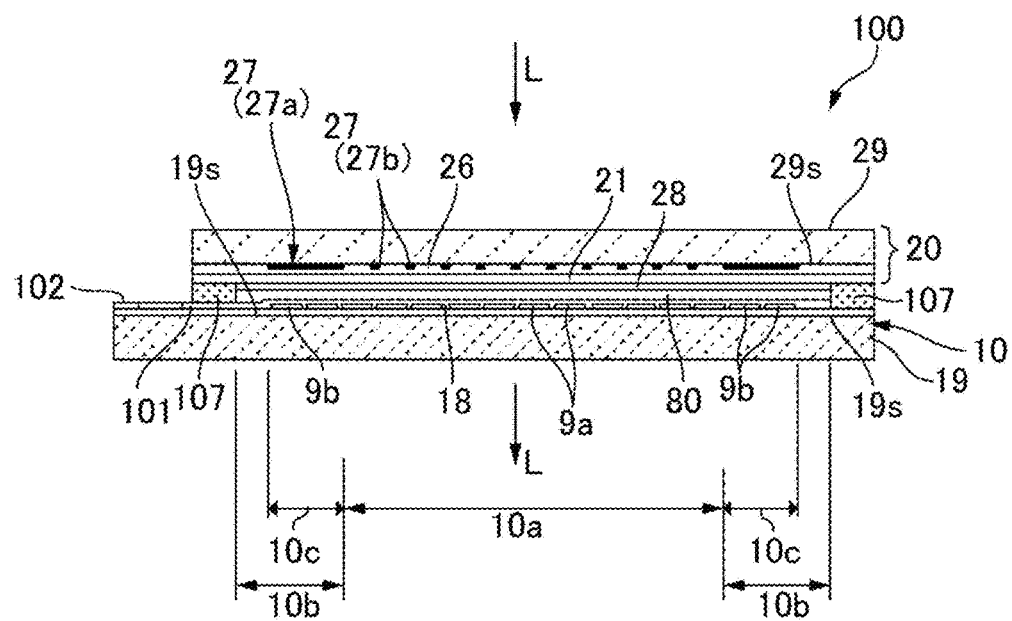
FIG. 2 is a cross-sectional view illustrating the electro-optical device illustrated in FIG. 1.

FIG. 1 is a plan view illustrating an electro-optical device 100 to which the invention is applied. FIG. 2 is a cross-sectional view illustrating the electro-optical device 100 illustrated in FIG. 1. As illustrated in FIG. 1 and FIG. 2, in the electro-optical device 100, a first side substrate 10 and a second side substrate 20 are stuck by a seal material 107, with a predetermined spacing between the first side substrate 10 and the second side substrate 20. The first side substrate 10 and the second side substrate 20 are facing each other. The seal material 107 is arranged in a frame shape along the outer edge of the second side substrate 20, and an electro-optical layer 80, such as a liquid crystal layer, is arranged in a region surrounded by the seal material 107 between the first side substrate 10 and the second side substrate 20. Accordingly, the electro-optical device 100 is configured as a liquid crystal device. The seal material 107 is a photosetting adhesive, or a photosetting and thermosetting adhesive, and contains a gap material, such as a glass fiber or glass bead, in order to set the distance between the both substrates to a predetermined value. Both the first side substrate 10 and the second side substrate 20 have a rectangular shape, and a display region 10a is arranged as a rectangular region at a substantially center of the electro-optical device 100. Accordingly, the seal material 107 is also arranged in a substantially rectangular shape, and a rectangular-shaped peripheral region 10b is arranged between the inner circumference edge of the seal material 107 and the outer circumference edge of the display region 10a.

The first side substrate 10 includes, as a substrate body, a first substrate 19 that is transmissive, such as a quartz substrate or a glass substrate. On a surface 19s side of the first substrate 19 on the side of the second side substrate 20, a data line drive circuit 101 and a plurality of terminals 102 are formed, outward of the display region 10a, along one side of the first substrate 10, and scan line drive circuits 104 are formed along other sides which are adjacent to the one side. A flexible wiring substrate (not illustrated) is coupled to the terminals 102, and various potentials and various signals are input to the first side substrate 10 via the flexible wiring substrate.

A plurality of pixel electrodes 9a, formed of Indium Tin Oxide (ITO) films and the like, that are transmissive, and pixel transistors (not illustrated in FIG. 2), electrically coupled to the plurality of respective pixel electrodes 9a are formed in a matrix shape in the display region 10a on the surface 19s of the first substrate 19. A first oriented film 18 is formed on the side of the second side substrate 20 relative to the pixel electrodes 9a, and covers the pixel electrodes 9a.

The second side substrate 20 includes, as a substrate body, a second substrate 29 that is transmissive, such as a quartz substrate, and a glass substrate. A common electrode 21, formed of ITO films and the like, is formed on the side of a surface 29s, which faces the first side substrate 10, of the second substrate 29, and a second oriented film 28 is formed on the side of the first side substrate 10 relative to the common electrode 21. The common electrode 21 is formed on a substantially entire surface of the second substrate 29 and is covered by the second oriented film 28. A light-shading light-shield layer 27, formed of resin, metal or a metal compound, is formed, on an opposite side to the first side substrate 10 relative to the common electrode 21, on the side of the surface 29s of the second substrate 29 and a transmissive protective layer 26 is formed between the light-shield layer 27 and the common electrode 21. The light-shield layer 27 is formed, for example, as a divider 27a in a frame shape that extends along the outer circumference edge of the display region 10a. The light-shield layer 27 is also formed as a light-shield layer 27b (black matrix) in a region that overlaps with a region between adjacent pixel electrodes 9a in a plan view. A dummy pixel electrode 9b which is simultaneously formed with the pixel electrode 9a is formed in a dummy pixel region 10c that overlaps the divider 27a in the peripheral region 10b of the first side substrate 10 in a plan view.

The first oriented film 18 and the second oriented film 28 includes an inorganic oriented film (vertical oriented film) formed of a diagonally vapor-deposited film, such as $SiO_x$ (x<2), $SiO_2$, $TiO_2$, MgO, $Al_2O_3$, and cause liquid crystal molecules, used for the electro-optical layer 80, that have negative dielectric anisotropy to be obliquely aligned. Therefore, the liquid crystal molecules form a prescribed angle with respect to the first side substrate 10 and the second side substrate 20. In this manner, the electro-optical device 100 is configured as a liquid crystal device in a Vertical Alignment (VA) mode.

In the first side substrate 10, an inter-substrate conduction electrode 109 is formed in a region that overlaps a corner part of the second side substrate 20 outward of the seal material 107, in order to allow for electrical conduction between the first side substrate 10 and the second side substrate 20. In the inter-substrate conduction electrode 109, an inter-substrate conduction material 109a that includes conductive particles is arranged. The common electrode 21 of the second side substrate 20 is electrically coupled to the side of the first side substrate 10 via the inter-substrate conduction material 109a and the inter-substrate conduction electrode 109. Therefore, a common potential is applied to the common electrode 21 from the side of the first side substrate 10.

In the electro-optical device 100 of the exemplary embodiment, the pixel electrodes 9a and the common electrode 21 are formed of ITO films (transmissive conductive films), and the electro-optical device 100 is formed as a transmission-type liquid crystal device. In the electro-optical device 100, an image is displayed in such a way that light is modulated when the light is incident on the electro-optical layer 80 from the first side substrate out of the first side substrate 10 and the second side substrate 20, passes through the second side substrate, and is then emitted. In the exemplary embodiment, as illustrated by arrow L, an image is displayed in such a way that light is modulated by the electro-optical layer 80 for each pixel when the light is incident on the second side substrate 20, passes through the first side substrate 10, and is then emitted.

Electrical Configuration of Electro-Optical Device 100

Figure 3:
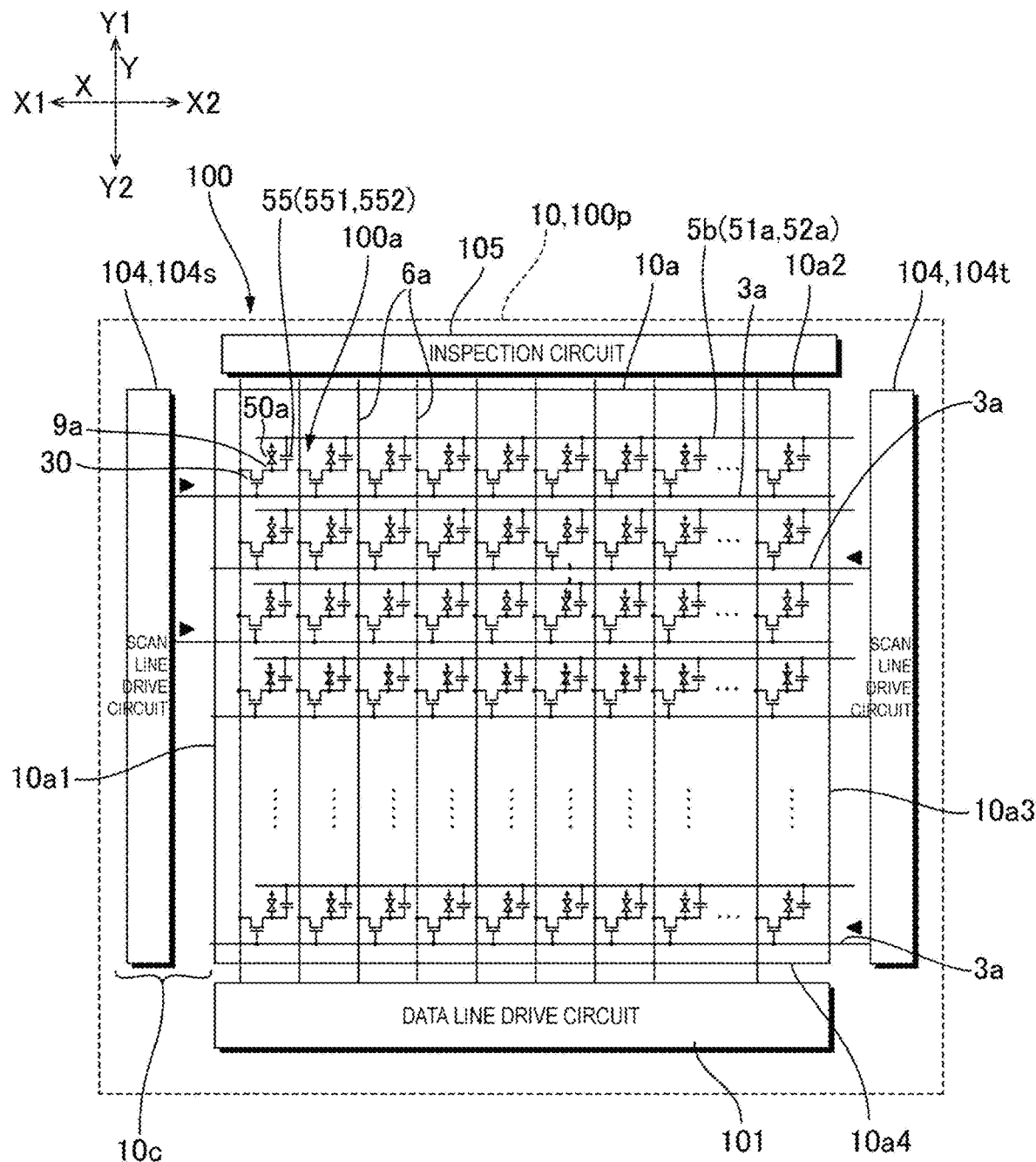
FIG. 3 is a block diagram illustrating an electrical configuration of the electro-optical device illustrated in FIG. 1.

FIG. 3 is a block diagram illustrating an electrical configuration of the electro-optical device 100 illustrated in FIG. 1. The electro-optical device 100 illustrated in FIG. 3 includes a liquid crystal panel 100p of the VA mode. The liquid crystal panel 100p is provided with a display region 10a, in a center region of the liquid crystal panel 100p, that includes a plurality of pixels 100a arranged in a matrix shape. In the first side substrate 10, described with reference to FIG. 1 and FIG. 2, a plurality of scan lines 3a and a plurality of data lines 6a are formed inward of the display region 10a of the liquid crystal panel 100p. The scan lines 3a extend in a first direction X. The data lines 6a extend in a second direction Y. The plurality of pixels 100a are configured that correspond to intersections between the plurality of scan lines 3a and the plurality of data lines 6a. The plurality of scan lines 3a are electrically coupled to the scan line drive circuit 104. The plurality of data lines 6a are coupled to the data line drive circuit 101. An inspection circuit 105 is electrically coupled to the plurality of data lines 6a on an opposite side to the data line drive circuit 101 in the second direction Y.

In each of the plurality of pixels 100a, a pixel transistor 30 formed of a field effect transistor and the like, and a pixel electrode 9a electrically coupled to the pixel transistor 30 are formed. The pixel transistor 30 has a source electrically coupled to the data line 6a, a gate electrically coupled to the scan line 3a, and a drain electrically coupled to the pixel electrode 9a. An image signal is supplied to the data line 6a, and a scan signal is supplied to the scan line 3a. In the present exemplary embodiment, the scan line drive circuits 104 include scan line drive circuits 104s and 104t respectively on a first side X1 and a second side X2 of the display region 10a in the X direction. The scan line drive circuit 104s on the first side X1 in the X direction drives odd numbered scan lines 3a and the scan line drive circuit 104t on the second side X2 in the X direction drives even numbered scan lines 3a.

In each of the pixels 100a, the pixel electrode 9a faces the common electrode 21 of the second substrate 29, described with reference to FIG. 1 and FIG. 2, via the electro-optical layer 80, and constitutes a liquid crystal capacitance 50a. In each of the pixels 100a, a holding capacitance 55, in parallel with the liquid crystal capacitance 50a, is added to prevent fluctuation of the image signal held by the liquid crystal capacitance 50a. In the present exemplary embodiment, a capacitance line 5b is formed to constitute a holding capacitance in the first substrate 19. The capacitance line 5b extends over the plurality of pixels 100a, and a common potential is supplied to the capacitance lines 5b.

In FIG. 3, the capacitance line 5b is illustrated as a single line extending in the first direction X. The capacitance line 5b according to the exemplary embodiment is constituted by a first capacitance line 51a extending in the first direction X and the second capacitance line 52a extending in the second direction Y, as described later. In FIG. 3, the maintenance capacitance 55 is illustrated as a single capacitance. The maintenance capacitance 55 is constituted by a first maintenance capacitance 551, formed with the first capacitance lines 51a, and a second maintenance capacitance 552, formed with the second maintenance capacitance lines 52a.

Detailed Configuration of Pixel

Figure 4:
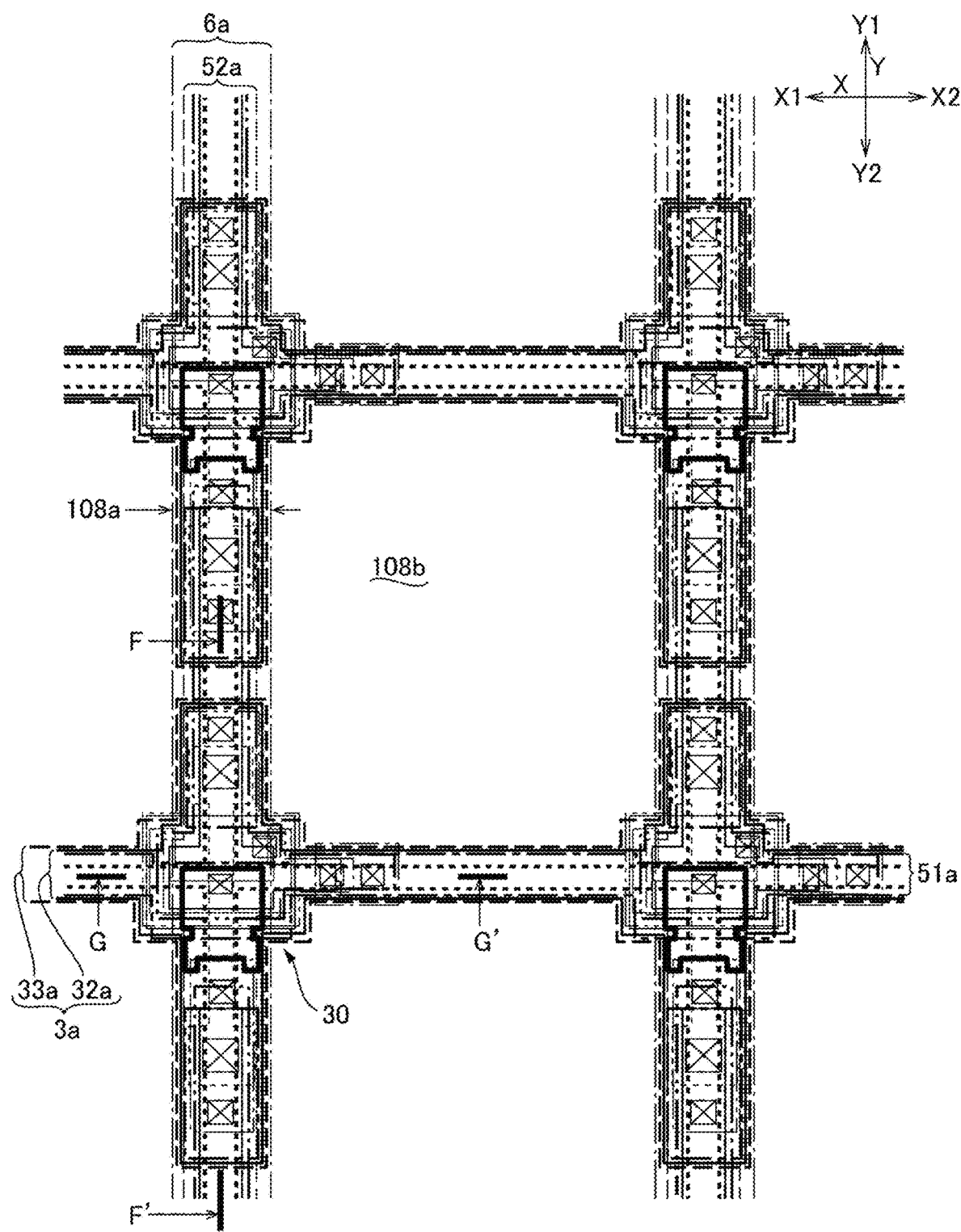
FIG. 4 is a plan view illustrating a plurality of pixels which are adjacent to each other in the electro-optical device illustrated in FIG. 1.
Figure 5:
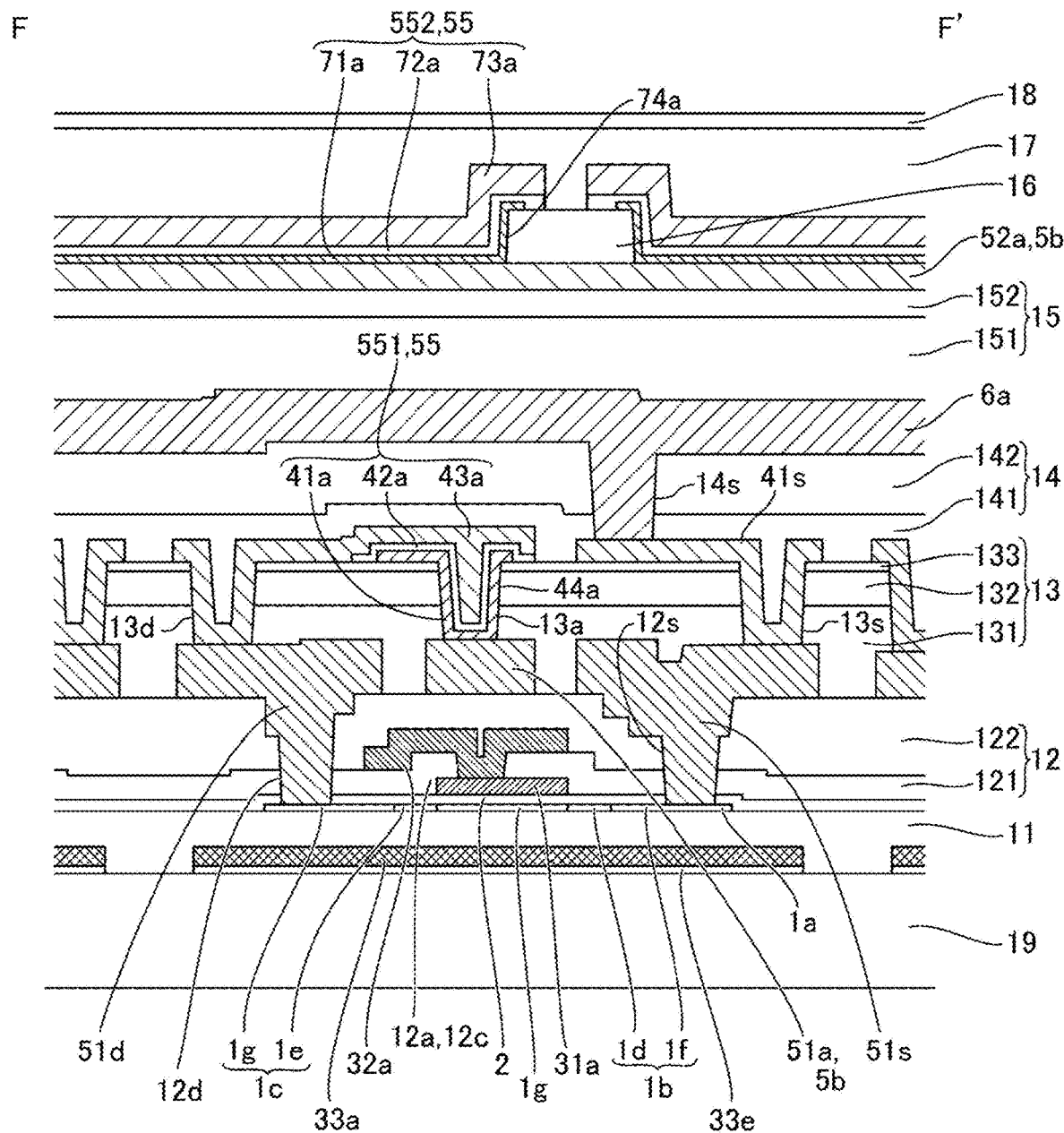
FIG. 5 is a cross-sectional view of the electro-optical device illustrated in FIG. 1, which is taken along line F-F'.
Figure 6:
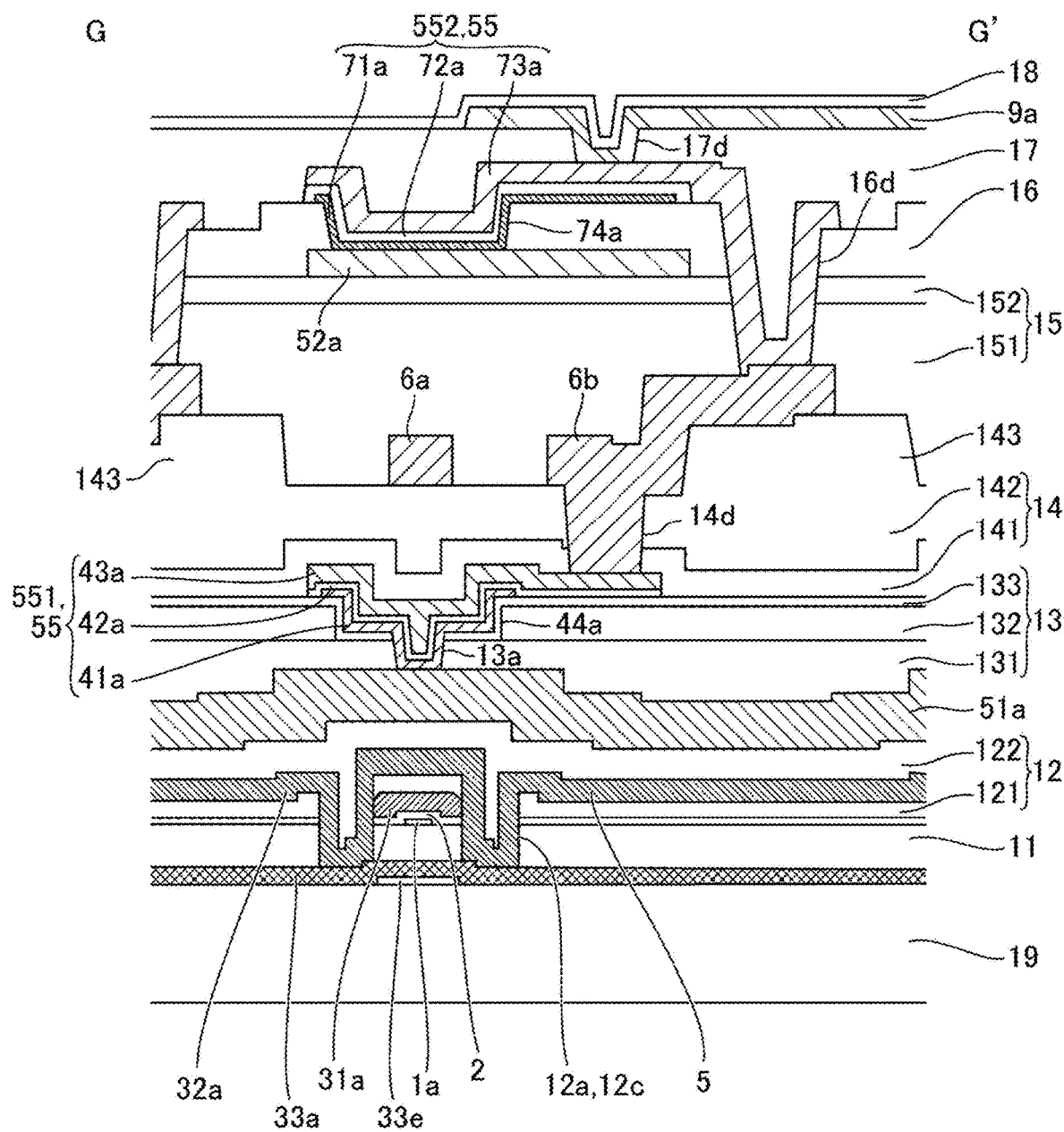
FIG. 6 is a cross-sectional view of the electro-optical device illustrated in FIG. 1, which is taken along line G-G'.

FIG. 4 is a plan view illustrating a plurality of pixels which are adjacent to each other in the electro-optical device 100 illustrated in FIG. 1. FIG. 5 is a cross-sectional view of the electro-optical device 100 illustrated in FIG. 1, which is taken along line F-F', or data line 6a. FIG. 6 is a cross-sectional view of the electro-optical device 100 illustrated in FIG. 1, which is taken along line G-G', or scan line 3a. In FIG. 6, a sectional view is taken such that the contact hole 17d for the pixel electrode 9a is included in the sectional view. In FIG. 4 and in FIG. 7 to FIG. 13 described later, layers are indicated by the lines described below. In FIG. 4 and in FIG. 7 to FIG. 13 described later, with regard to a layer that has an end portion overlapping with an end portion of another layer in a plan view, the position of the end portion is shifted such that the shape and the like of the layer is easily understood.

A thick broken line represents the second scan line 33a.

A thin and short dotted line represents the semiconductor layer 1a.

A solid line with medium thickness represents the scan line 32a.

A thick solid line represents the gate electrode 31a.

A thick one-dot chain line represents the first capacitance line 51a, source electrode 51s, and drain electrode 51d.

A thin solid line represents the first capacitance electrode 41a.

A thin two-dot chain line represents the second capacitance electrode 43a.

A thin one-dot chain line represents the data line 6a, and relay electrode 6b.

A thin and long broken line represents the second capacitance line 52a.

A solid line with medium thickness represents the third capacitance electrode 71a.

A thick two-dot chain line represents the fourth capacitance electrode 73a.

A thick and short dotted line represents the pixel electrode 9a.

A solid line represents the contact hole.

As illustrated in FIG. 4, the pixel electrode 9a is formed for each of the plurality of pixels on the surface of the first side substrate 10 that faces the second side substrate 20. The data line 6a and the scan lines 3a (the first scan line 32a and the second scan line 33a) are each formed along an inter pixel region between the adjacent pixel electrodes 9a. The scan line 3a extends along the first direction X in the interpixel region. The data line 6a extends in the second direction Y in the interpixel region. The pixel transistor 30 is formed that corresponds to an intersection between the data line 6a and the scan line 3a. The first capacitance line 51a extends in the first direction X to overlap with the scan line 3a in a plan view. The second capacitance line 52a extends in the second direction Y to overlap with the data line 6a in a plan view. The scan line 3a, the data line 6a, the first capacitance line 51a, and the second capacitance line 52a each have a light-shading property. Thus, a region where the scan line 3a, the data line 6a, the first capacitance line 51a, and the second capacitance line 52a are formed serves as a light-shield region 108a through which light does not pass. A region surrounded by the light-shield region 108a serves as an opening region 108b (transmissive region) through which light passes.

As illustrated in FIG. 5 and FIG. 6, on a surface 19s side of the first substrate 19 in the first side substrate 10, the second scan line 33a, the semiconductor layer 1a, the gate insulation layer 2, the gate electrode 31a, the first scan line 32a, the first capacitance line 51a, the first capacitance electrode 41a, the first dielectric layer 42a, the second capacitance electrode 43a, the data line 6a, the second capacitance line 52a, the third capacitance electrode 71a, the second dielectric layer 72a, the fourth capacitance electrode 73a, and the pixel electrode 9a are laminated in this order. The pixel transistor 30 includes the semiconductor layer 1a arranged between the first substrate 19 and the pixel electrode 9a, the gate electrode 31a arranged on the side of the pixel electrode 9a of the semiconductor layer 1a, the source electrode 51s arranged between the pixel electrode 9a and the semiconductor layer 1a, and the drain electrode 51d arranged between the pixel electrode 9a and the semiconductor layer 1a.

The inter-layer insulation film 11 is formed between the second scan line 33a and the semiconductor layer 1a. The inter-layer insulation film 12 is formed between the gate electrode 31a and the first capacitance line 51a. The inter-layer insulation film 13 is formed between the first capacitance line 51a and the first capacitance electrode 41a. The inter-layer insulation film 14 is formed between the second capacitance electrode 43a and the data line 6a. The inter-layer insulation film 15 is formed between the data line 6a and the second capacitance line 52a. The inter-layer insulation film 16 is formed between the second capacitance line 52a and the third capacitance electrode 71a. The inter-layer insulation film 17 is formed between the fourth capacitance electrode 73a and the pixel electrode 9a. The inter-layer insulation films 11 to 17 are each a transmissive insulation film formed of a silicon oxide film and the like. In the present exemplary embodiment, the inter-layer insulation film 12 is a laminated film including inter-layer insulation films 121 and 122. The inter-layer insulation film 13 is a laminated film including inter-layer insulation films 131, 132, and 133. A flattening process such as Chemical Mechanical Polishing (CMP) is performed on a surface of the inter-layer insulation film 131, on the side of the pixel electrode 9a, to cause the surface to be flat. Accordingly, the inter-layer insulation film 132 has a flat surface on the side of the pixel electrode 9a, and the inter-layer insulation film 133 has a flat surface on the side of the pixel electrode 9a (a surface of the inter-layer insulation film 13 on the side of the pixel electrode 9a).

The inter-layer insulation film 14 is a laminated film including inter-layer insulation films 141 and 142. The inter-layer insulation film 15 is a laminated film including inter-layer insulation films 151 and 152. The inter-layer insulation film 151 has a surface, on the side of the pixel electrode 9a, treated by a flattening process, such as CMP, to be flat. Accordingly, the inter-layer insulation film 152 has a flat surface on the side of the pixel electrode 9a (a surface of the inter-layer insulation film 15 on the side of the pixel electrode 9a). A flattening process such as CMP is performed on surfaces of the inter-layer insulation films 11 and 17 on the side of the pixel electrode 9a, to cause the surfaces to be flat.

In the invention, the "first inter-layer insulation film", the "second inter-layer insulation film", the "third inter-layer insulation film", the "fourth inter-layer insulation film", the "fifth inter-layer insulation film", and the "sixth inter-layer insulation film" correspond to the inter-layer insulation films 11 to 17 as described below.

The first inter-layer insulation film corresponds to the inter-layer insulation film 12.

The second inter-layer insulation film corresponds to the inter-layer insulation film 13.

The third inter-layer insulation film corresponds to the inter-layer insulation film 16.

The fourth inter-layer insulation film corresponds to the inter-layer insulation film 11.

The fifth inter-layer insulation film corresponds to the inter-layer insulation film 121.

The sixth inter-layer insulation film corresponds to the inter-layer insulation film 122.

Detailed Description of Each Layer

Figure 7:
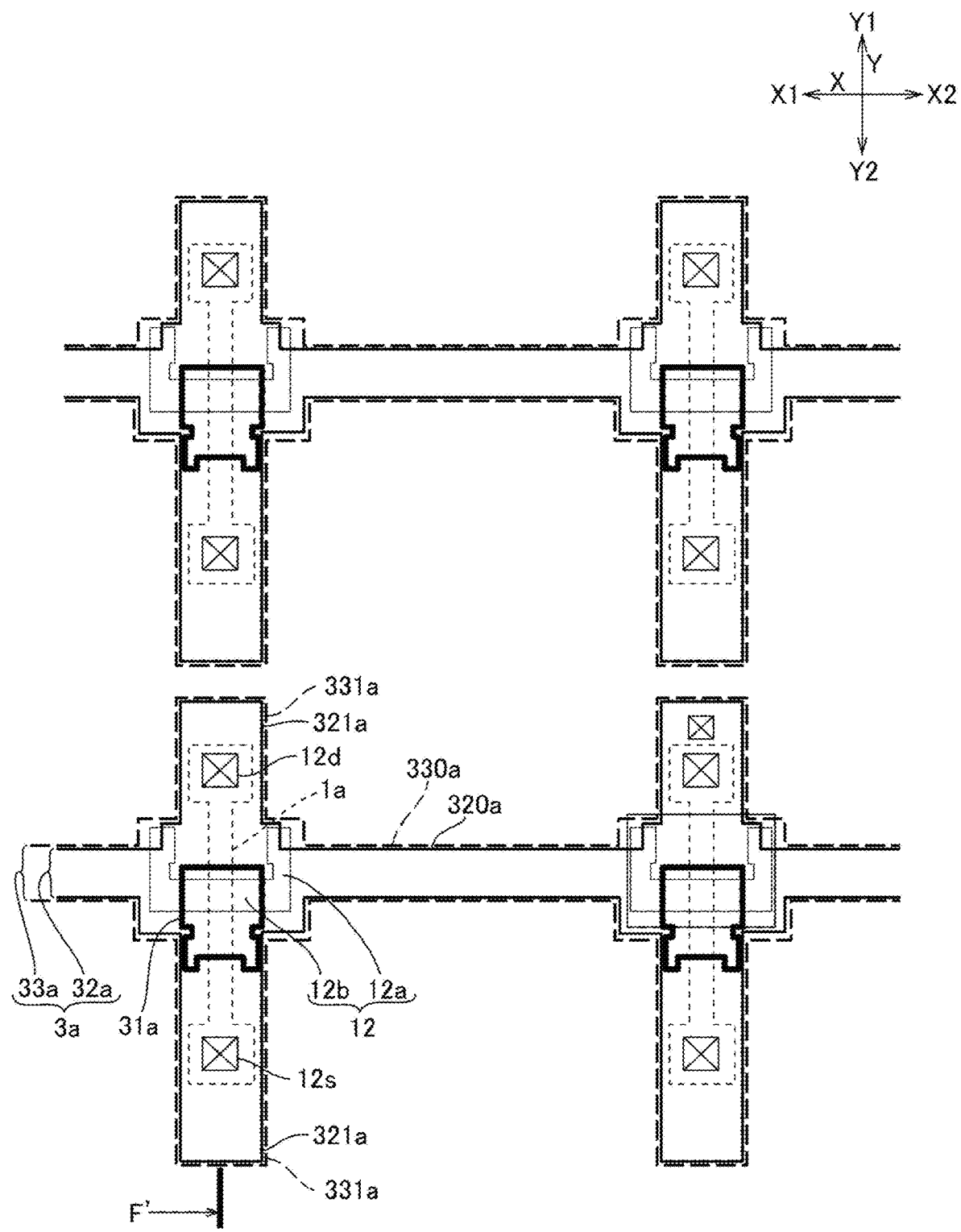
FIG. 7 is a plan view illustrating a scan line, a semiconductor layer, a gate electrode, and the like illustrated in FIG. 5 and FIG. 6.
Figure 8:
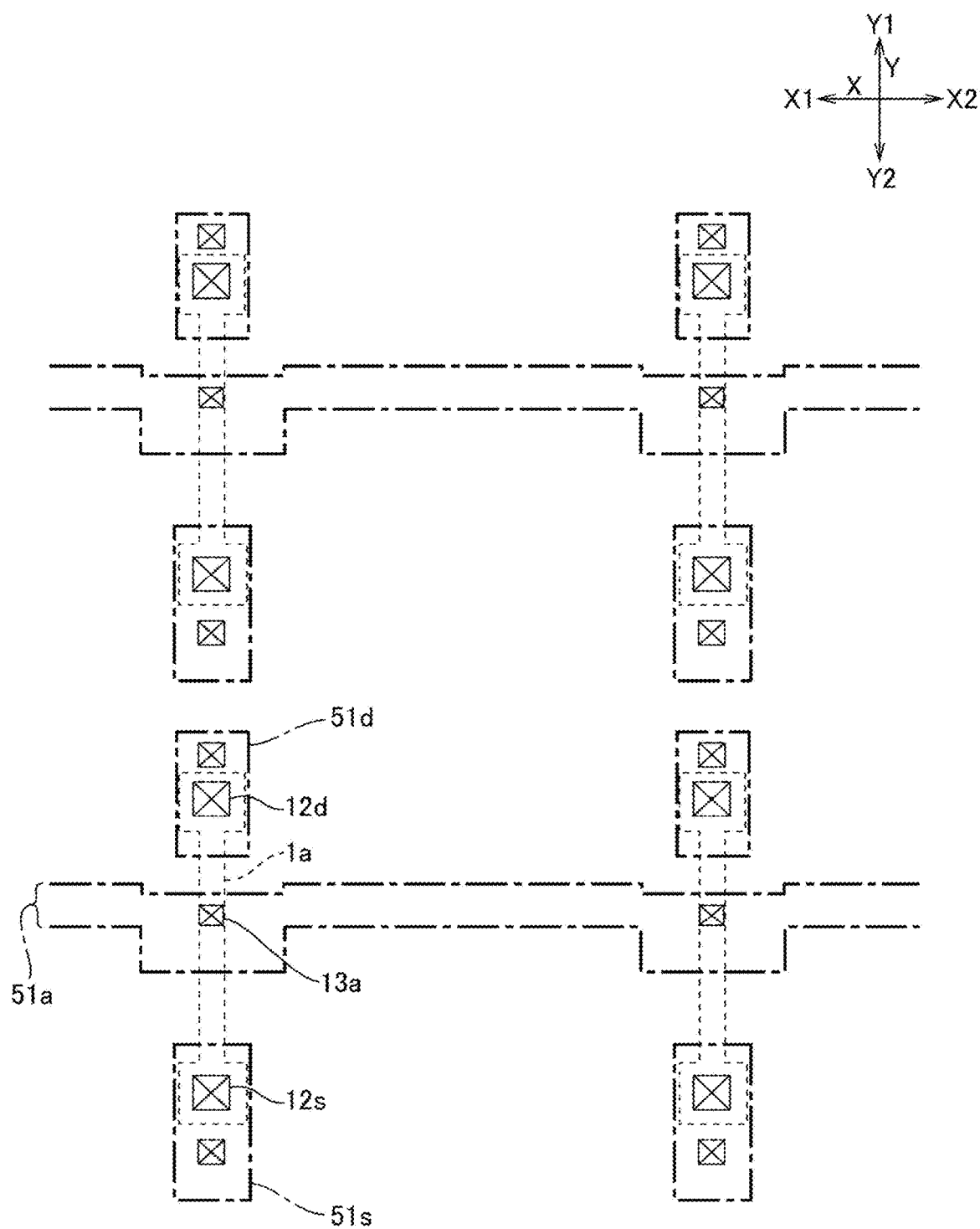
FIG. 8 is a plan view illustrating a first capacitance line, a source electrode, a drain electrode, and the like illustrated in FIG. 5 and FIG. 6.
Figure 9:
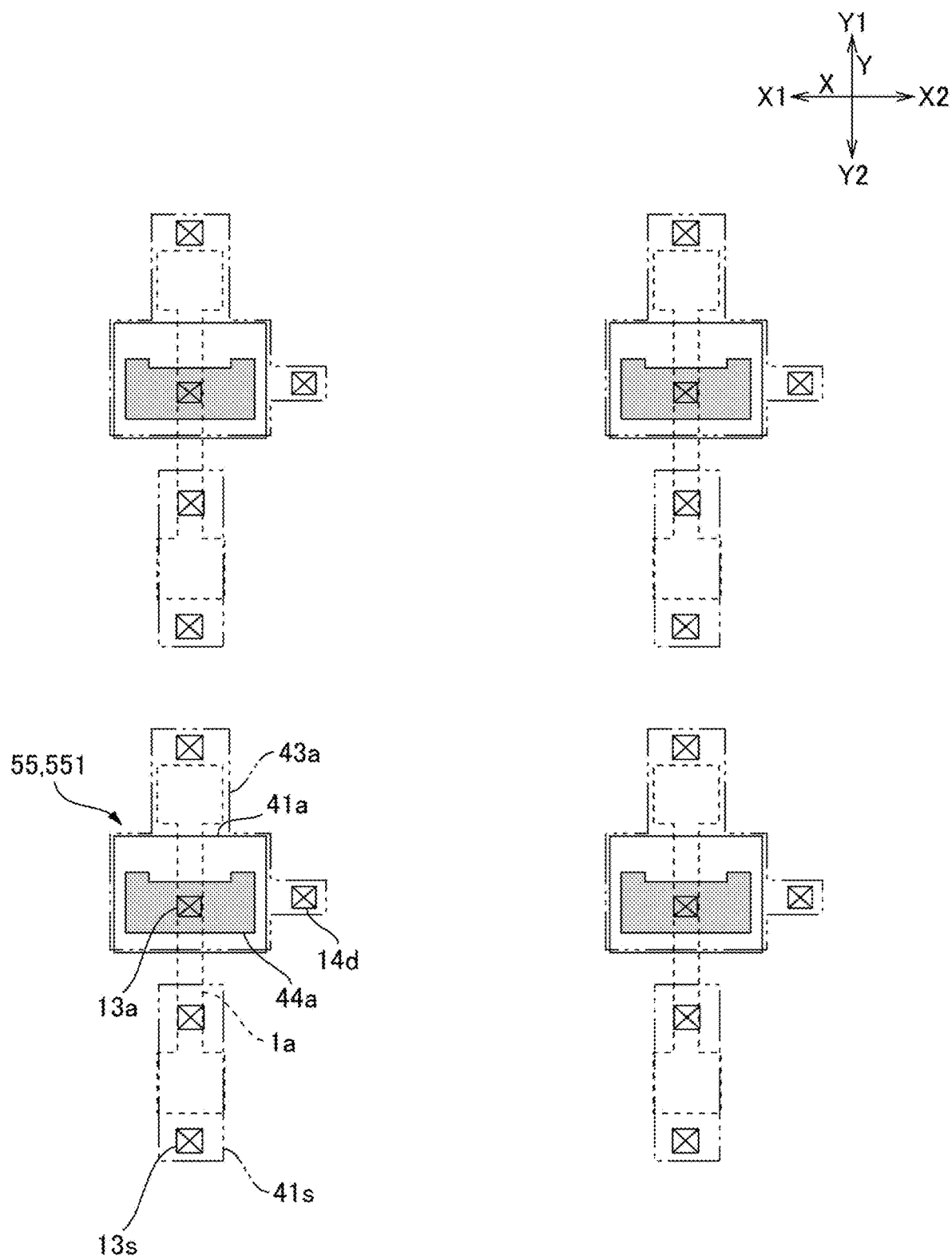
FIG. 9 is a plan view illustrating a first capacitance electrode, a second capacitance electrode, and the like illustrated in FIG. 5 and FIG. 6.
Figure 10:
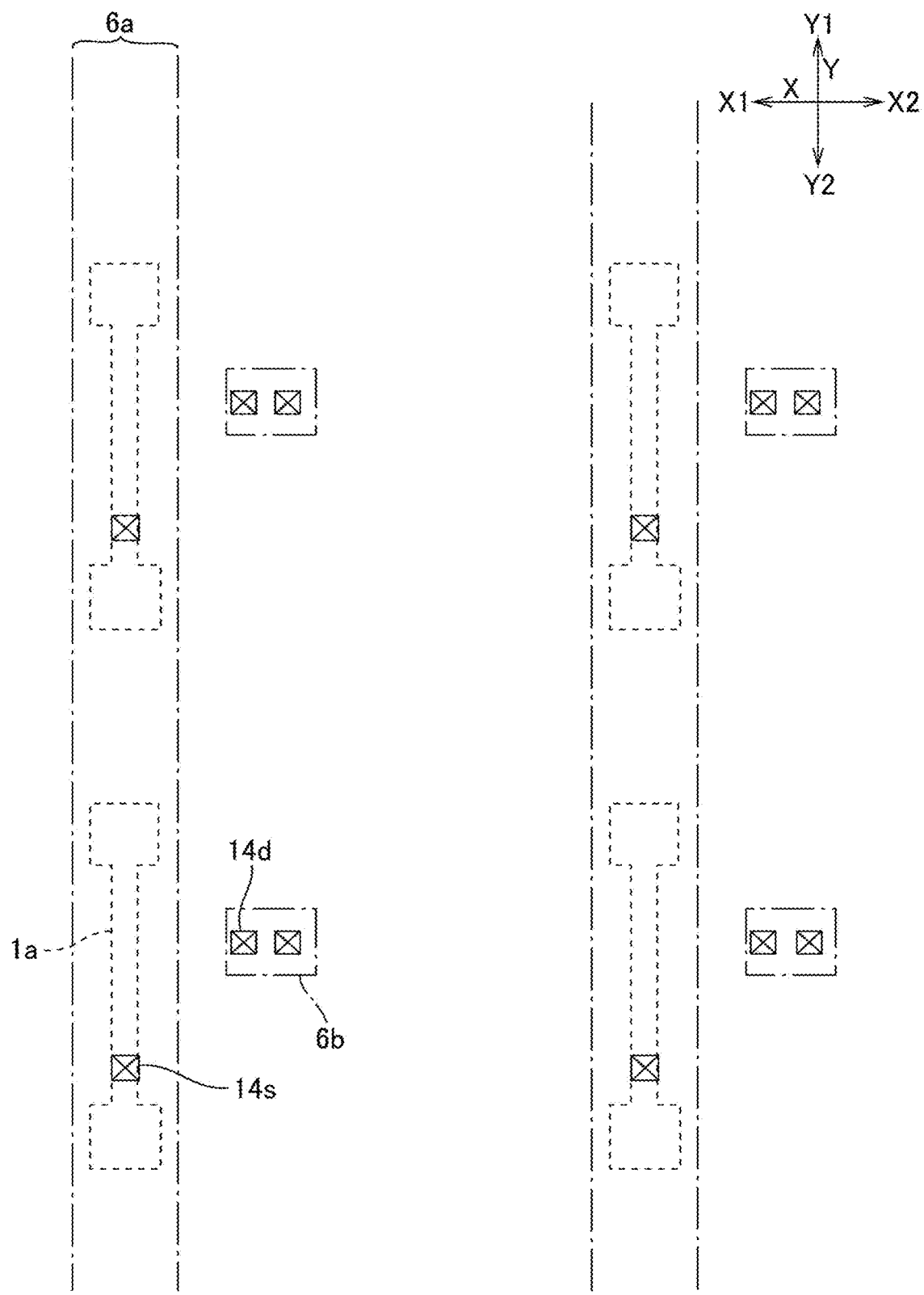
FIG. 10 is a plan view illustrating a data line, a relay electrode, and the like illustrated in FIG. 5 and FIG. 6.
Figure 11:
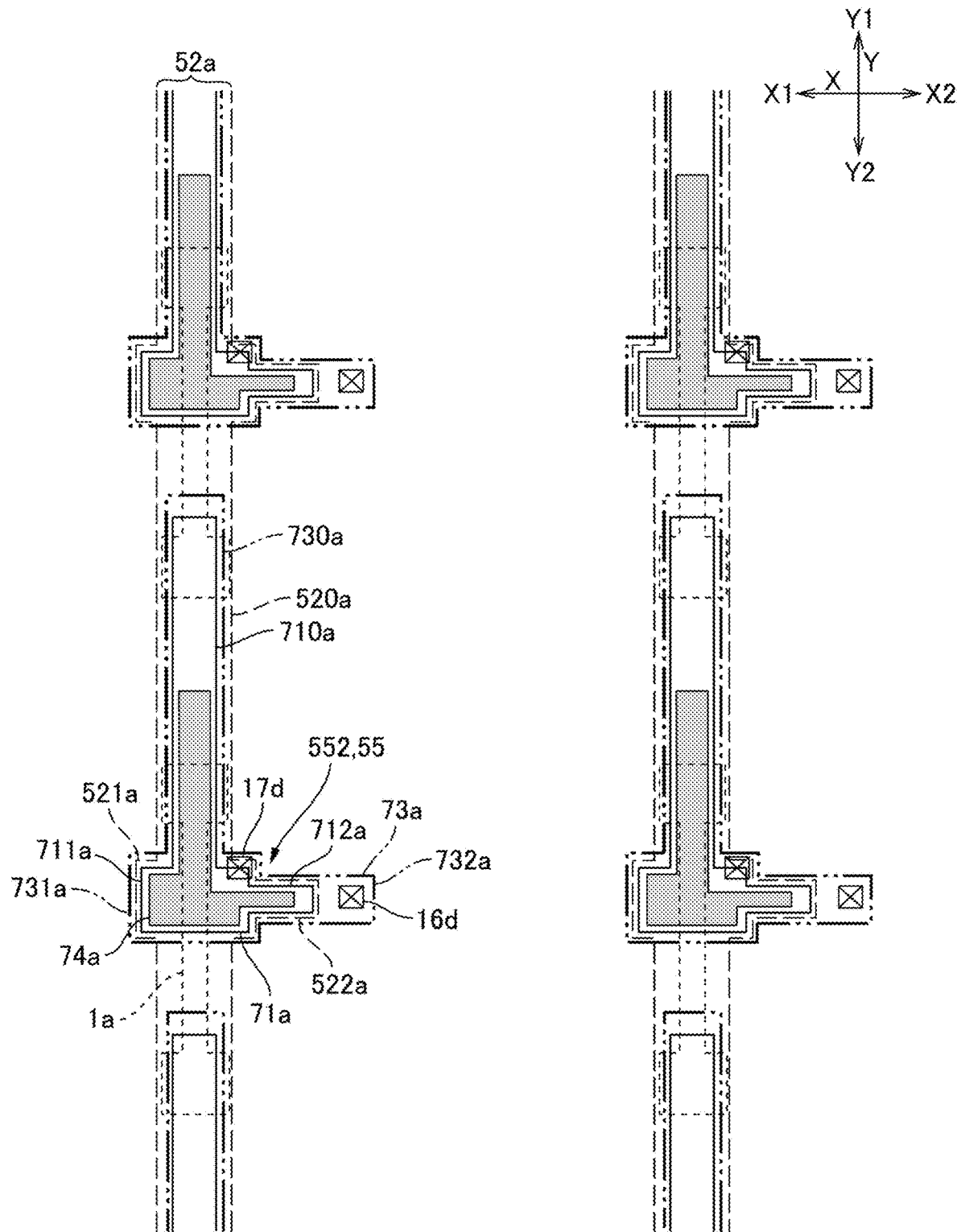
FIG. 11 is a plan view illustrating a second capacitance line, a third capacitance electrode, a fourth capacitance electrode, and the like illustrated in FIG. 5 and FIG. 6.
Figure 12:
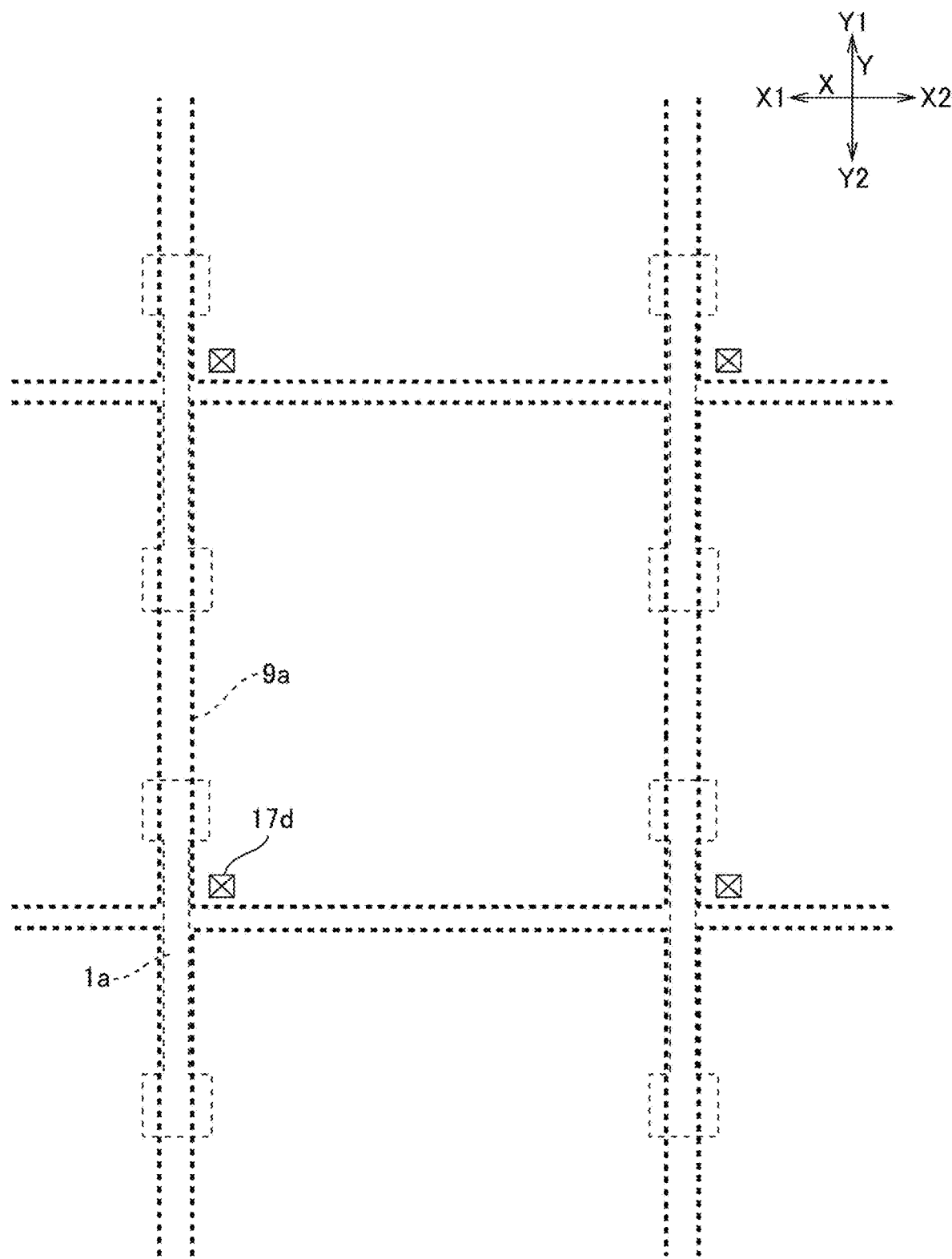
FIG. 12 is a plan view illustrating a pixel electrode and the like illustrated in FIG. 5 and FIG. 6.
Figure 13:
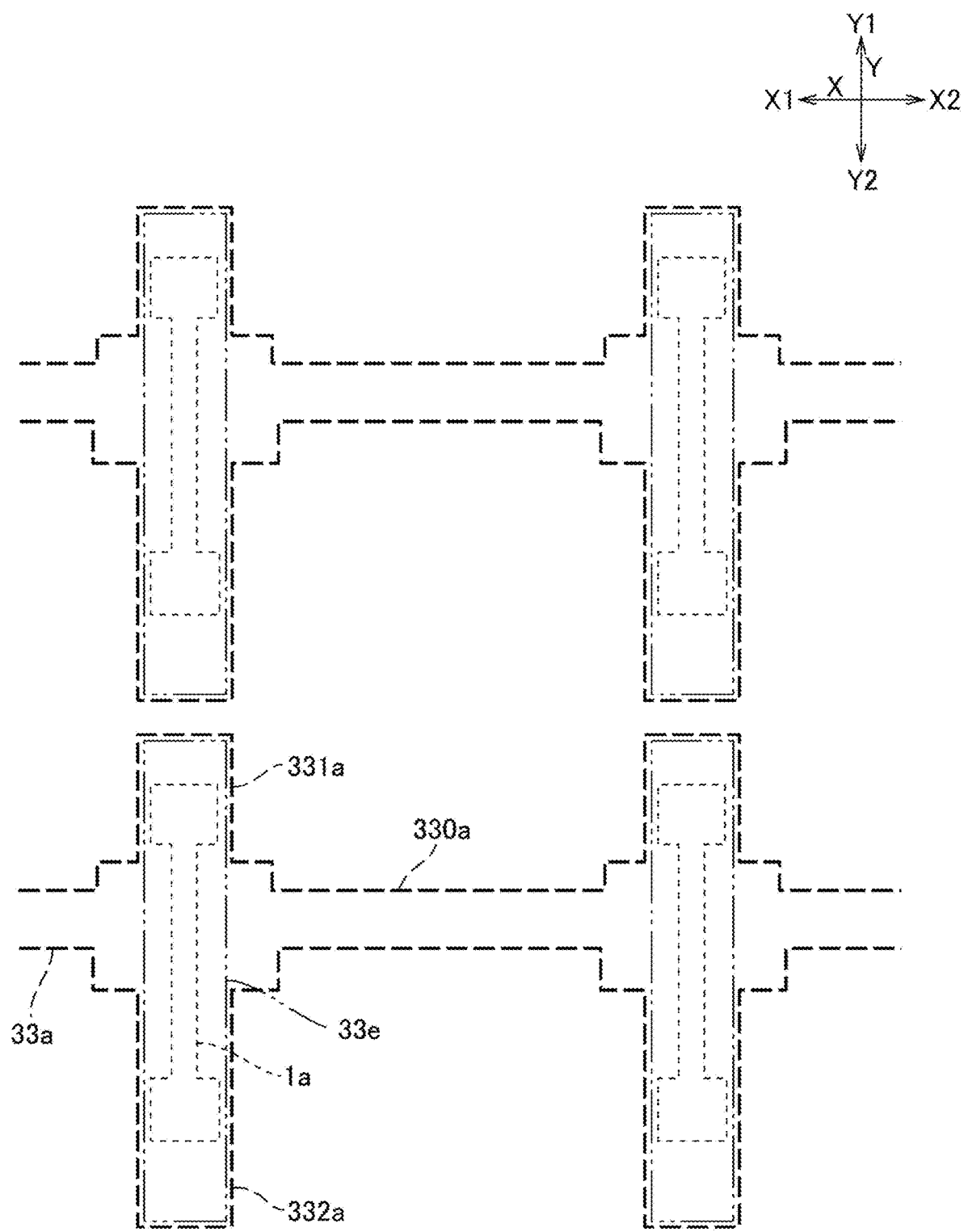
FIG. 13 is a plan view illustrating a second scan line and the like illustrated in FIG. 5 and FIG. 6.

A detailed configuration of the first side substrate 10 is described below by referring to FIG. 5 and FIG. 6, and by referring to FIGS. 7 to 13, described later, as appropriate. FIG. 7 is a plan view illustrating the scan line 3a, the semiconductor layer 1a, the gate electrode 31a, and the like illustrated in FIG. 5 and FIG. 6. FIG. 8 is a plan view illustrating the first capacitance line 51a, the source electrode 51s, the drain electrode 51d, and the like illustrated in FIG. 5 and FIG. 6. FIG. 9 is a plan view illustrating the first capacitance electrode 41a, the second capacitance electrode 43a, and the like illustrated in FIG. 5 and FIG. 6. FIG. 10 is a plan view illustrating the data line 6a, the relay electrode 6b, and the like illustrated in FIG. 5 and FIG. 6. FIG. 11 is a plan view illustrating the second capacitance line 52a, the third capacitance electrode 71a, the fourth capacitance electrode 73a, and the like illustrated in FIG. 5 and FIG. 6. FIG. 12 is a plan view illustrating the pixel electrode 9a and the like illustrated in FIG. 5 and FIG. 6. FIG. 13 is a plan view illustrating the second scan line 33a and the like illustrated in FIG. 5 and FIG. 6. FIG. 7 to FIG. 12 illustrate contact holes that relate to electrical coupling of electrodes and the like illustrated in the figures, as well as the semiconductor layer 1a to indicate a reference position.

As illustrated in FIG. 5, FIG. 6, and FIG. 7, in the first side substrate 10, the light-shielding second scan line 33a extending in the first direction X is formed between the first substrate 19 and the semiconductor layer 1a, and the inter-layer insulation film 11 (fourth inter-layer insulation film) is formed between the semiconductor layer 1a and the second scan line 33a. The second scan line 33a is formed of a conductive film such as a conductive polysilicon film, a metal silicide film, a metal film, or a metal compound film. In the present exemplary embodiment, the second scan line 33a is formed of a light-shielding film formed of tungsten silicide (WSi), tungsten, titanium nitride, and the like. The second scan line 33a includes a main line section 330a extending in the first direction X and protruding sections 331a and 332a respectively protruding, along the data line 6a, on both sides in the second direction Y from the main line section 330a.

The semiconductor layer 1a of the pixel transistor 30 is formed on the surface of the inter-layer insulation film 11 on the side of the pixel electrode 9a, and is covered by the gate insulation layer 2 from the side of the pixel electrode 9a. The semiconductor layer 1a is formed of a polysilicon film (polycrystalline silicon film) and the like, and has a long-side direction along the direction in which the data line 6a extends. The gate insulation layer 2 has a two-layered structure which includes a first gate insulation layer formed of a silicon oxide film acquired by performing thermal oxidation on the semiconductor layer 1a, and a second gate insulation layer formed of a silicon oxide film formed by a decompression CVD method and the like.

The light-shielding gate electrode 31a is formed on a surface of the gate insulation layer 2 on the side of the pixel electrode 9a. The first scan line 32a extends in the first direction X, between the semiconductor layer 1a and the inter-layer insulation film 12, and is electrically coupled to the gate electrode 31a. The first scan line 32a is formed of a light-shield layer. In the present exemplary embodiment, the first scan line 32a includes a main line section 320a extending in the first direction X and protruding sections 321a and 322a protruding along the data line 6a, on both sides in the second direction Y from the main line section 320a.

The gate electrode 31a overlaps with a center portion of the semiconductor layer 1a in the longitudinal direction. The semiconductor layer 1a includes a channel region 1i, which faces the gate electrode 31a via the gate insulation layer 2, and includes a source region 1b on one side of the channel region 1i and a drain region 1c on the other side of the channel region 1i. The pixel transistor 30 has a lightly-doped-drain (LDD) structure. Accordingly, the source region 1b includes a low concentration region 1d on one side of the channel region 1i and the source region 1c includes a low concentration region 1g on the other side of the channel region 1i. The source region 1b includes a high-concentration region 1f in a region adjacent to the low concentration region on the opposite side of the low concentration region with respect to the channel region 1i. The source region 1c includes a high-concentration region 1g in a region adjacent to the low concentration region on the opposite side of the low concentration region with respect to the channel region 1i. The gate electrode 31a and the first scan line 32a are each formed of a conductive film such as a conductive polysilicon film, a metal silicide film, a metal film, or a metal compound film. For example, in the exemplary embodiment, the gate electrode 31a and the first scan line 32a are each formed of a multi-layer structure titanium (Ti) layer/titanium nitride (TiN) layer/aluminum (Al) layer/TiN layer, or a multi-layer structure TiN layer/Al layer/TiN layer.

In the exemplary embodiment, the gate electrode 31a is arranged between the inter-layer insulation film 121 (fifth inter-layer insulation film), which is a lower side layer in the inter-layer insulation film 12 (first inter-layer insulation film), and the semiconductor layer 1a. The first scan line 32a is formed between the inter-layer insulation film 121 (fifth inter-layer insulation film) in the inter-layer insulation film 12 (first inter-layer insulation film) and the inter-layer insulation film 122 (sixth inter-layer insulation film).

In the inter-layer insulation film 121 and the inter-layer insulation film 11, a contact hole 12a (first contact hole), through which the first scan line 32a and the second scan line 33a are electrically coupled, is formed through the inter-layer insulation film 121 and the inter-layer insulation film 11. In the inter-layer insulation film 121, a contact hole 12b (second contact hole), through which the first scan line 32a and the gate electrode 31a are electrically coupled, is formed through the inter-layer insulation film 121. In the exemplary embodiment, the contact hole 12a and the contact hole 12b are continuous in a plan view to constitute an integrated contact hole 12c.

As illustrated in FIG. 5, FIG. 6, and FIG. 8, the light-shielding first capacitance line 51a, overlapping with the gate electrode 31a in a plan view, is formed on the surface of the inter-layer insulation film 12 on the side of the pixel electrode 9a. A common potential is applied to the first capacitance line 51a. The first capacitance line 51a extends in the first direction X and overlaps with the first scan line 32a in a plan view. The source electrode 51s and the drain electrode 51d are formed at positions, on the surface of the inter-layer insulation film 12 on the side of the pixel electrode 9a, separated from the first capacitance line 51a in the second direction Y. The source electrode 51s and the drain electrode 51d are formed of a conductive layer identical to a conductive layer of which the first capacitance line 51a is formed. The source electrode 51s and the drain electrode 51d are respectively coupled to the source region 1b and the drain region 1c electrically through the contact holes 12s and 12d formed through the inter-layer insulation film 12. The first capacitance line 51a, the source electrode 51s, and the drain electrode 51d are each formed of a conductive film such as a conductive polysilicon film, a metal silicide film, a metal film, or a metal compound film. For example, in the exemplary embodiment, the first capacitance line 51a, the source electrode 51s, and the drain electrode 51d each have a multi-layer structure of Ti layer/TiN layer/Al layer/TiN layer, or a multi-layer structure of TiN layer/Al layer/TiN layer.

As illustrated in FIG. 5, FIG. 6, and FIG. 9, the first recess section 44a, overlapping with the first capacitance line 51a in a plan view, is formed in the inter-layer insulation film 13. The light-shielding first capacitance electrode 41a and the light-shielding second capacitance electrode 43a are formed in the region overlapping with the first recess section 44a. The light-shielding first capacitance electrode 41a extends from the bottom of the first recess section 44a to the surface of the inter-layer insulation film 13 on the side of the pixel electrode 9a. The light-shielding second capacitance electrode 43a overlaps with the first capacitance electrode 41a from the side of the pixel electrode 9a. The second capacitance electrode 43a is electrically coupled to the drain electrode 51d and the pixel electrode 9a. The first capacitance electrode 41a and the second capacitance electrode 43a are each formed of the conductive film such as the conductive polysilicon film, the metal silicide film, the metal film, or the metal compound film. In the exemplary embodiment, the first capacitance electrode 41a and the second capacitance electrode 43a are each formed of a TiN layer and the like.

The first capacitance electrode 41a is electrically coupled to the first capacitance line 51a at the bottom of the first recess section 44a. More specifically, at the bottom of the first recess section 44a, the contact hole 13a is formed through the inter-layer insulation film 13, and the first capacitance electrode 41a is electrically coupled to the first capacitance line 51a through the contact hole 13a. The first dielectric layer 42a is formed between the first capacitance electrode 41a and the second capacitance electrode 43a. The first capacitance electrode 41a, the first dielectric layer 42a, and the second capacitance electrode 43a constitute a first holding capacitance 551 of the holding capacitance 55. For the first dielectric layer 42a, a silicon compound such as a silicon oxide film and a silicon nitride film may be used, or a dielectric layer that has a high dielectric constant, such as an aluminum oxide film, a titanium oxide film, a tantalum oxide film, a niobium oxide film, a hafnium oxide film, a lanthanum oxide film, and a zirconium oxide film may be used.

The relay electrode 41s, overlapping with the source electrode 51s in a plan view, is formed at a position, on the surface of the inter-layer insulation film 13 on the side of the pixel electrode 9a, separated from the first capacitance electrode 41a in the second direction Y. The relay electrode 41s is formed of a conductive layer identical to a conductive layer of which the first capacitance electrode 41a is formed. The relay electrode 41s is electrically coupled to the source electrode 51s through the contact hole 13s formed through the inter-layer insulation film 13. The second capacitance electrode 43a is electrically coupled to the drain electrode 51d through the contact hole 13d formed through the inter-layer insulation film 13.

As illustrated in FIG. 5, FIG. 6, and FIG. 10, the light-shielding data line 6a is formed to extend in the second direction Y on the surface of the inter-layer insulation film 14 on the side of the pixel electrode 9a. The data line 6a is electrically coupled to the relay electrode 41s through the contact hole 14s formed through the inter-layer insulation film 14. Thus, the data line 6a is electrically coupled to the source region 1b via the relay electrode 41s and the source electrode 51s. The data line 6a is formed of a conductive film such as a conductive polysilicon film, a metal silicide film, a metal film, and a metal compound film. For example, in the exemplary embodiment, the data line 6a has a multi-layer structure of Ti layer/TiN layer/Al layer/TiN layer, or a multi-layer structure of TiN layer/Al layer/TiN layer.

The relay electrode 6b, overlapping with the second capacitance electrode 43a in a plan view, is formed at a position, on the other side X2 in the first direction X, separated from the data line 6a. The relay electrode 6b is electrically coupled to the second capacitance electrode 43a through the contact hole 14d formed through the inter-layer insulation film 14. The relay electrode 6b is formed of a conductive layer identical to a conductive layer of which the data line 6a is formed.

As illustrated in FIG. 5, FIG. 6, and FIG. 11, the light-shielding second capacitance line 52a, extending in the second direction Y to overlap with the data line 6a in a plan view, is formed on the surface of the inter-layer insulation film 15 on the side of the pixel electrode 9a. A common potential is applied to the second capacitance line 52a. A second recess section 74a, formed of a through hole overlapping with the second capacitance line 52a in a plan view, is formed on the inter-layer insulation film 16. The light-shielding third capacitance electrode 71a and the light-shielding fourth capacitance electrode 73a are formed in a region overlapping with the second recess section 74a. The third capacitance electrode 71a extends from the bottom of the second recess section 74a to the surface of the inter-layer insulation film 16 on the side of the pixel electrode 9a. The fourth capacitance electrode 73a overlaps with the third capacitance electrode 71a from the side of the pixel electrode 9a. The second capacitance line 52a includes a main body section 520a and protruding sections 521a and 522a. The main body section extends in the second direction Y along the data line 6a. The protruding sections 521a and 522a respectively protrude on one side X1 and the other side X2 in the first direction X from the main body section 520a. The third capacitance electrode 71a includes a main body section 710a and protruding sections 711a and 712a, and the fourth capacitance electrode 73a includes a main body section 730a and protruding sections 731a and 732a. The main body section 710a extends, along the data line 6a, toward one side Y1 in the second direction Y, and the protruding sections 711a and 712a respectively protrude on one side X1 and the other side X2 in the first direction X from the main body section 710a. The main body sections 730a extends, along the data line 6a, toward one side Y1 in the second direction Y, and the protruding sections 731a and 732a respectively protrude on one side X1 and the other side X2 in the first direction X from the main body section 730a. The second recess section 74a extends toward one side Y1 in the second direction Y.

The fourth capacitance electrode 73a is electrically coupled to the drain electrode 51d and the pixel electrode 9a. More specifically, the fourth capacitance electrode 73a is electrically coupled to the relay electrode 6b through the contact hole 16d formed through the inter-layer insulation films 15 and 16. The second capacitance line 52a is formed of a conductive film such as a conductive polysilicon film, a metal silicide film, a metal film, and a metal compound film. For example, in the exemplary embodiment, the second capacitance line 52a, the source electrode 51s, and the drain electrode 51d each have a multi-layer structure Ti layer/TiN layer/Al layer/TiN layer, or a multi-layer structure TiN layer/Al layer/TiN layer.

In the inter-layer insulation film 14, in the exemplary embodiment, a protruding section 143, protruding on the side of the pixel electrode 9a, is formed in a region overlapping with the contact hole 16d in a plan view. Thus, a thickness of the inter-layer insulation film 15 at a portion, where the contact hole 16d of the inter-layer insulation film 16 is formed, is thinner than a thickness of the inter-layer insulation film 15 at a peripheral portion. Accordingly, an aspect ratio of the contact hole 16d can be reduced, thus allowing the fourth capacitance electrode 73a to be electrically coupled to the relay electrode 6b in an appropriate manner. For example, this aspect can be achieved by forming the inter-layer insulation film 15 and then performing etching and the like to reduce the thickness of the inter-layer insulation film 15 at a portion other than a portion where the contact hole 16d is formed.

The third capacitance electrode 71a is electrically coupled to the second capacitance line 52a at the bottom of the second recess section 74a. The second dielectric layer 72a is formed between the third capacitance electrode 71a and the fourth capacitance electrode 73a. The third capacitance electrode 71a, the second dielectric layer 72a, and the fourth capacitance electrode 73a constitute a second maintenance capacitance 552 of the maintenance capacitance 55. For the second dielectric layer 72a, a silicon compound such as a silicon oxide film or a silicon nitride film may be used, or a dielectric layer, which has a high dielectric constant, such as an aluminum oxide film, a titanium oxide film, a tantalium oxide film, a niobium oxide film, a hafnium oxide film, a lanthanum oxide film, or a zirconium oxide film may be used. The third capacitance electrode 71a and the fourth capacitance electrode 73a are each formed of the conductive film such as the conductive polysilicon film, the metal silicide film, the metal film, and the metal compound film. In the exemplary embodiment, the third capacitance electrode 71a and the fourth capacitance electrode 73a are each formed of a TiN layer and the like.

As illustrated in FIG. 5, FIG. 6, and FIG. 12, the pixel electrode 9a is formed on a surface of the inter-layer insulation film 17 on an opposite side with respect to the first substrate 19. The pixel electrode 9a is electrically coupled to the fourth capacitance electrode 73a through the contact hole 17d formed through the inter-layer insulation film 17. Thus, the pixel electrode 9a is electrically coupled to the drain region 1c via the fourth capacitance electrode 73a, the relay electrode 6b, the second capacitance electrode 43a, and the drain electrode 51d.

As illustrated in FIG. 5, FIG. 6, and the FIG. 13, a light-shield layer 33e, overlapping with the semiconductor layer 1a in a plan view, is formed between the second scan line 33a and the first substrate 19. In the exemplary embodiment, the light-shield layer 33e extends in the second direction Y to overlap with the semiconductor layer 1a in a region overlapping with the light-shield layer 33e in a plan view. Thus, the second scan line 33a has a high light-shielding performance for the semiconductor layer 1a.

Main Advantage of Exemplary Embodiment

As described above, in the electro-optical device 100 according to the exemplary embodiment, the first maintenance capacitance 551 is constituted by the first capacitance electrode 41a, the first dielectric layer 42a, and the second capacitance electrode 43a that overlap on the bottom, the inner walls, and the like of the first recess section 44a formed in the inter-layer insulation film 13 (second inter-layer insulation film), and thus allowing for a high electrostatic capacitance even when an occupied planer area is small. This configuration requires the inter-layer insulation film 13 (second inter-layer insulation film) to have a thickness to some extent, because the inner wall of the first recess section 44a is used for forming the first maintenance capacitance 551. Thus, the inter-layer insulation film 12 (first inter-layer insulation film) needs to be thin. Still, the first capacitance line 51a is formed on the surface of the inter-layer insulation film 12 on the side of the pixel electrode 9a, and the first capacitance line 51a shields a section between the second capacitance electrode 43a to which the drain potential is applied and the gate electrode 31a, and a section between the second capacitance electrode 43a to which the drain potential is applied and the first scan line 32a. This can prevent an occurrence of electrical coupling between the gate and the drain.

The source electrode 51s and the drain electrode 51d are formed of a conductive layer identical to a conductive layer of which the first capacitance line 51a is formed, and thus the source electrode 51s, the drain electrode 51d, and the first capacitance line 51a can be formed in the same process.

In the first side substrate 10, the second maintenance capacitance 552 is formed by the third capacitance electrode 71a, the second dielectric layer 72a, and the fourth capacitance electrode 73a that overlap on the bottom, the inner walls and the like of the second recess section 74a formed in the inter-layer insulation film 16 (third inter-layer insulation film), and thus allowing for a high electrostatic capacitance even when an occupied planer area is small. Thus, the maintenance capacitance 55 includes the first maintenance capacitance 551 and the second maintenance capacitance 552 that are electrically coupled in parallel, and thus has a large electrostatic capacitance. Thus, with the exemplary embodiment, a high-quality image can be displayed.

The first capacitance line 51a extends in the first direction X to overlap with the first scan line 32a. The second capacitance line 52a extends in the second direction Y to overlap with the data line 6a. Thus, the first capacitance line 51a and the second capacitance line 52a can be used, together with the first scan line 32a and the data line 6a, for shielding the semiconductor layer 1a from light from the side of the pixel electrode 9a. This prevents a malfunction due to photoelectric current from occurring in the pixel transistor 30.

The inter-layer insulation film 13 (second inter-layer insulation film) has a flat surface on the side of the pixel electrode 9a. Thus, the first capacitance electrode 41a, the first dielectric layer 42a, and the second capacitance electrode 43a can be appropriately formed, and the second capacitance line 52a, the third capacitance electrode 71a, second dielectric layer 72a, and the fourth capacitance electrode 73a can be appropriately formed.

The first side substrate 10 has the second scan line 33a extending in the first direction X to overlap with the first scan line 32a, between the first substrate 19 and the semiconductor layer 1a, and the first scan line 32a is electrically coupled to the second scan line 33a. Thus, redundant wiring can be configured with the first scan line 32a and the second scan line 33a, and the second scan line 33a can be used for shielding the semiconductor layer 1a from light from the side of the first substrate 19. This prevents a malfunction due to photoelectric current from occurring in the pixel transistor 30.

In the first side substrate 10, the gate electrode is arranged between the inter-layer insulation film 121 (fifth inter-layer insulation film), in the inter-layer insulation film 12, and the semiconductor layer 1a in the first side substrate 10, and the first scan line 32a is arranged between the inter-layer insulation film 121 (fifth inter-layer insulation film) and the inter-layer insulation film 122 (sixth inter-layer insulation film) in the inter-layer insulation film 12. Thus, the first scan line 32a can be configured to have a shape and the like appropriate for transmitting signals and shielding light, regardless of the shape and the like of the gate electrode 31a.

Other Exemplary Embodiments

In the exemplary embodiment described above, the redundant wiring is configured with the first scan line 32a and the second scan line 33a. Alternatively, the invention may be applied to a case where only one of the first scan line 32a and the second scan line 33a is formed. The first scan line 32a and the gate electrode 31a are formed on different layers. Alternatively, the invention may be applied to a case where the gate electrode 31a forms a part of the first scan line 32a. In the exemplary embodiment described above, the first maintenance capacitance 551 and the second maintenance capacitance 552 are formed. Alternatively, the invention may be applied to a case where only the first maintenance capacitance 551 is formed. In the exemplary embodiment described above, light from a light source is incident from the side of the second side substrate 20. Alternatively, the invention may be applied to a case where the light from the light source is incident from the side of the first side substrate 10.

Mounting Example on Electronic Apparatus

Figure 14:
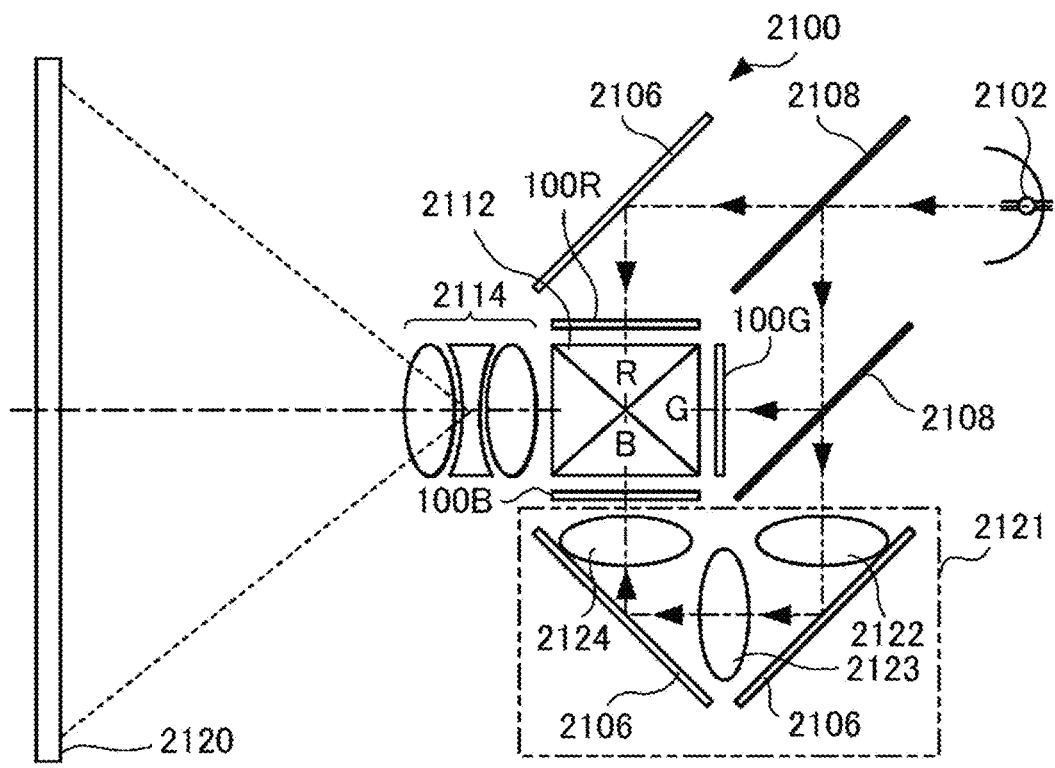
FIG. 14 is a schematic configuration diagram illustrating a transmission-type display apparatus (electrical apparatus) using the electro-optical device to which the invention is applied.

An electronic apparatus using the electro-optical device 100 according to the exemplary embodiment described above is described. FIG. 14 is a schematic configuration diagram illustrating a transmission-type display apparatus (electronic apparatus) using the electro-optical device 100 to which the invention is applied. FIG. 14 illustrates a transmission-type display apparatus 2100 that is an example of the electronic apparatus using the electro-optical device 100. The transmission-type display apparatus 2100 uses the electro-optical device 100 as a light valve, and thus can achieve high-definition and bright displaying without using a large size of the apparatus. As illustrated in the figure, the transmission-type display apparatus 2100 is provided with a lamp unit 2102 (light source unit) including a white light source such as a halogen lamp. Projection light, that has been emitted from the lamp unit 2102, is split into light beams of three primary colors that are red (R), green (G), and blue (B), by three mirrors 2106 and two dichroic mirrors 2108 internally arranged. The light beams, that has been split from the projection light, are respectively guided to and modulated by light valves 100R, 100G, and 100B corresponding to the primary colors. Note that the blue light beam B is guided through a relay lens system 2121, including an incident lens 2122, a relay lens 2123, and an emission lens 2124, to prevent a loss due to a longer optical path than the other light beams R and G.

The light beams, that has been modulated by the light valves 100R, 100G, and 100B, are incident on the dichroic prism 2112 from three directions. The red and the blue light beams are reflected by the dichroic prism 2112 by 90°, and the green light beam G passes through the dichroic prism 2112. Then, images of the primary colors are synthesized, and the resultant color image is projected onto a screen 2120 by a projection lens group 2114 (projection optical system).

Other Transmission-Type Display Apparatuses

In the transmission-type display apparatus, LED light sources, which emit light of the respective colors, and the like may be used as the light-source section, and respective colors which are emitted from the LED light sources may be supplied to a separated liquid crystal apparatus.

Other Electronic Apparatuses

The electronic apparatus including the electro-optical device 100 to which the invention is applied is not limited to the transmission-type display apparatus 2100 according to the exemplary embodiment described above. Examples of the electronic apparatus may include a projection-type Head-Up Display (HUD) or a direct viewing type Head Mounted Display (HMD), a personal computer, a digital camera, and a liquid crystal television.

The entire disclosure of Japanese Patent Application No. 2017-204206, filed Oct. 23, 2017 is expressly incorporated by reference herein.

What is claimed is:

1. An electro-optical device comprising:
   a first side substrate provided with a pixel electrode on one side of a first substrate;
   a second side substrate, provided with a common electrode to which a common potential is applied on a surface of a second substrate on a side of the first side substrate, the second substrate facing the first side substrate; and
   an electro-optical layer arranged between the first side substrate and the second side substrate, wherein
   the first side substrate includes
   a pixel transistor including:
     a semiconductor layer arranged between the first substrate and the pixel electrode;
     a gate electrode arranged on a side of the pixel electrode with respect to the semiconductor layer;
     a source electrode arranged between the pixel electrode and the semiconductor layer, and electrically coupled to a source region of the semiconductor layer; and
     a drain electrode arranged between the pixel electrode and the semiconductor layer, and electrically coupled to a drain region of the semiconductor layer,
   a first scan line extending in a first direction and electrically coupled to the gate electrode,
   a data line, between the semiconductor layer and the pixel electrode, extending in a second direction intersecting the first direction, and electrically coupled to the source electrode,
   a first inter-layer insulation film covering the gate electrode from a side of the pixel electrode,
   a first capacitance line to which the common potential is applied, the first capacitance line extending on a surface of the first inter-layer insulation film on the side of the pixel electrode to overlap with the gate electrode in a plan view,
   a second inter-layer insulation film covering the first capacitance line from the side of the pixel electrode, and including a first recess section that overlaps with the first capacitance line in a plan view,
   a first capacitance electrode arranged from a bottom of the first recess section to a surface of the second inter-layer insulation film on the side of the pixel electrode, and electrically coupled to the first capacitance line at the bottom of the first recess section,
   a second capacitance electrode overlapping with the first capacitance electrode from the side of the pixel electrode and electrically coupled to the drain electrode and the pixel electrode,
   a first dielectric layer, arranged between the first capacitance electrode and the second capacitance electrode, for constituting, with the first capacitance electrode and the second capacitance electrode, a first holding capacitance,
   a second capacitance line to which the common potential is applied, the second capacitance line extending between the second capacitance electrode and the pixel electrode,
   a third inter-layer insulation film covering the second capacitance line from the side of the pixel electrode, and including a second recess section that overlaps with the second capacitance line in a plan view,
   a third capacitance electrode arranged from a bottom of the second recess section to a surface of the third inter-layer insulation film on the side of the pixel electrode, and electrically coupled to the second capacitance line at the bottom of the second recess section,
   a fourth capacitance electrode overlapping with the second capacitance electrode from the side of the pixel electrode, and electrically coupled to the drain electrode and the pixel electrode, and
   a second dielectric layer, arranged between the third capacitance electrode and the fourth capacitance electrode, for constituting, with the third capacitance electrode and the fourth capacitance electrode, a second holding capacitance.

2. The electro-optical device according to claim 1, wherein the source electrode and the drain electrode are formed of a conductive layer identical to a conductive layer of which the first capacitance line is formed, on the surface of the first inter-layer insulation film on the side of the pixel electrode.

3. The electro-optical device according to claim 1, wherein
   the second capacitance line extends in the second direction to overlap with the data line.

4. The electro-optical device according to claim 1, wherein the second inter-layer insulation film has a flat surface on the side of the pixel electrode.

5. The electro-optical device according to claim 1, wherein
   the first scan line extends in the first direction between the semiconductor layer and the first inter-layer insulation film, and
   the first capacitance line extends in the first direction to overlap with the first scan line in a plan view.

6. An electronic apparatus comprising the electro-optical device according to claim 1.

7. An electro-optical device comprising:
   a first side substrate provided with a pixel electrode on one side of a first substrate,
   a second side substrate, provided with a common electrode to which a common potential is applied on a surface of a second substrate on a side of the first side substrate, the second substrate facing the first side substrate, and
   an electro-optical layer arranged between the first side substrate and the second side substrate, wherein
   the first side substrate includes
   a pixel transistor including:

a semiconductor layer arranged between the first substrate and the pixel electrode;

a gate electrode arranged on a side of the pixel electrode with respect to the semiconductor layer;

a source electrode arranged between the pixel electrode and the semiconductor layer, and electrically coupled to a source region of the semiconductor layer; and a drain electrode arranged between the pixel electrode and the semiconductor layer, and electrically coupled to a drain region of the semiconductor layer, a first scan line extending in a first direction and electrically coupled to the gate electrode, a data line, between the semiconductor layer and the pixel electrode, extending in a second direction intersecting the first direction, and electrically coupled to the source electrode, a first inter-layer insulation film covering the gate electrode from a side of the pixel electrode, a first capacitance line to which the common potential is applied, the first capacitance line extending on a surface of the first inter-layer insulation film on the side of the pixel electrode to overlap with the gate electrode in a plan view, a second inter-layer insulation film covering the first capacitance line from the side of the pixel electrode, and including a first recess section that overlaps with the first capacitance line in a plan view, a first capacitance electrode arranged from a bottom of the first recess section to a surface of the second inter-layer insulation film on the side of the pixel electrode, and electrically coupled to the first capacitance line at the bottom of the first recess section, a second capacitance electrode overlapping with the first capacitance electrode from the side of the pixel electrode and electrically coupled to the drain electrode and the pixel electrode, a first dielectric layer, arranged between the first capacitance electrode and the second capacitance electrode, for constituting, with the first capacitance electrode and the second capacitance electrode, a first holding capacitance, the first scan line extends in the first direction between the semiconductor layer and the first inter-layer insulation film, the first capacitance line extends in the first direction to overlap with the first scan line in a plan view, a second scan line extending in the first direction to overlap with the first scan line, between the first substrate and the semiconductor layer, and a fourth inter-layer insulation film arranged between the semiconductor layer and the second scan line, and the first scan line is electrically coupled to the second scan line through a first contact hole formed through the fourth inter-layer insulation film.

8. An electro-optical device comprising:

a first side substrate provided with a pixel electrode on one side of a first substrate;

a second side substrate, provided with a common electrode to which a common potential is applied on a surface of a second substrate on a side of the first side substrate, the second substrate facing the first side substrate; and an electro-optical layer arranged between the first side substrate and the second side substrate, wherein the first side substrate includes a pixel transistor including:

a semiconductor layer arranged between the first substrate and the pixel electrode;

a gate electrode arranged on a side of the pixel electrode with respect to the semiconductor layer;

a source electrode arranged between the pixel electrode and the semiconductor layer, and electrically coupled to a source region of the semiconductor layer, and a drain electrode arranged between the pixel electrode and the semiconductor layer, and electrically coupled to a drain region of the semiconductor layer, a first scan line extending in a first direction and electrically coupled to the gate electrode, a data line, between the semiconductor layer and the pixel electrode, extending in a second direction intersecting the first direction, and electrically coupled to the source electrode, a first inter-layer insulation film covering the gate electrode from a side of the pixel electrode, a first capacitance line to which the common potential is applied, the first capacitance line extending on a surface of the first inter-layer insulation film on the side of the pixel electrode to overlap with the gate electrode in a plan view, a second inter-layer insulation film covering the first capacitance line from t e side of the pixel electrode, and including a first recess section that overlaps with the first capacitance line in a plan view, a first capacitance electrode arranged from a bottom of the first recess section to a surface of the second inter-layer insulation film on the side of the pixel electrode, and electrically coupled to the first capacitance line at the bottom of the first recess section, a second capacitance electrode overlapping with the first capacitance electrode from the side of the pixel electrode and electrically coupled to the drain electrode and the pixel electrode, and a first dielectric layer, arranged between the first capacitance electrode and the second capacitance electrode, for constituting, with the first capacitance electrode and the second capacitance electrode, a first holding capacitance, the first inter-layer insulation film includes a fifth inter-layer insulation film arranged between the semiconductor layer and the first capacitance line, and a sixth inter-layer insulation film arranged between the fifth inter-layer insulation film and the first capacitance line, the gate electrode is arranged between the fifth inter-layer insulation film in the first inter-layer insulation film and the semiconductor layer, the first scan line is arranged between the fifth inter-layer insulation film and the sixth inter-layer insulation film in the first inter-layer insulation film, and a second contact hole through which the first scan line and the gate electrode are electrically coupled is formed in the fifth inter-layer insulation film.

* * * * *